United States Patent
More

(10) Patent No.: US 11,610,890 B2
(45) Date of Patent: Mar. 21, 2023

(54) EPITAXY REGIONS EXTENDING BELOW STI REGIONS AND PROFILES THEREOF

(71) Applicant: Taiwan Semiconductor Manufacturing Co., Ltd., Hsinchu (TW)

(72) Inventor: Shahaji B. More, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/167,336

(22) Filed: Feb. 4, 2021

(65) Prior Publication Data

US 2022/0052044 A1 Feb. 17, 2022

Related U.S. Application Data

(60) Provisional application No. 63/078,960, filed on Sep. 16, 2020, provisional application No. 63/065,192, filed on Aug. 13, 2020.

(51) Int. Cl.

| | |
|---|---|
| *H01L 29/76* | (2006.01) |
| *H01L 29/94* | (2006.01) |
| *H01L 27/092* | (2006.01) |
| *H01L 29/78* | (2006.01) |
| *H01L 29/66* | (2006.01) |
| *H01L 21/8234* | (2006.01) |
| *H01L 29/06* | (2006.01) |

(52) U.S. Cl.
CPC .. *H01L 27/0924* (2013.01); *H01L 21/823431* (2013.01); *H01L 21/823468* (2013.01); *H01L 29/0649* (2013.01); *H01L 29/6656* (2013.01); *H01L 29/66795* (2013.01); *H01L 29/7851* (2013.01)

(58) Field of Classification Search
CPC ......... H01L 27/0924; H01L 21/823431; H01L 21/823468; H01L 29/0649; H01L 29/6656; H01L 29/66795; H01L 29/7851; H01L 21/28518; H01L 29/41791; H01L 21/76805; H01L 21/76897; H01L 29/665; H01L 29/785; H01L 29/161; H01L 29/165; H01L 29/7848; H01L 29/66545; H01L 21/823418; H01L 21/823814; H01L 21/823821; H01L 27/0886
USPC ....................................................... 257/288
See application file for complete search history.

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |

(Continued)

*Primary Examiner* — Theresa T Doan
(74) *Attorney, Agent, or Firm* — Slater Matsil, LLP

(57) ABSTRACT

A method includes forming isolation regions extending into a semiconductor substrate, forming a plurality of semiconductor fins protruding higher than top surfaces of the isolation regions, forming a gate stack on the plurality of semiconductor fins, forming a gate spacer on a sidewall of the gate stack, and recessing the plurality of semiconductor fins to form a plurality of recesses on a side of the gate stack. The plurality of recesses extend to a level lower than top surfaces of the isolation regions. Epitaxy processes are performed to grow an epitaxy region, wherein the epitaxy region fills the plurality of recesses.

20 Claims, 29 Drawing Sheets

(56) References Cited

U.S. PATENT DOCUMENTS

| | | |
|---|---|---|
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 * | 11/2017 | Liao ................ H01L 21/823431 |
| 9,859,380 B2 | 1/2018 | Lee et al. |

* cited by examiner

US 11,610,890 B2

EPITAXY REGIONS EXTENDING BELOW STI REGIONS AND PROFILES THEREOF

PRIORITY CLAIM AND CROSS-REFERENCE

This application claims the benefit of the U.S. Provisional Application No. 63/065,192, filed Aug. 13, 2020, and entitled "STI confined Shape of Shielding Layer (L1) in EPI," and Provisional Application No. 63/078,960, filed Sep. 16, 2020, and entitled "STI confined Shape of Shielding Layer (L1) in EPI," and is related to application Ser. No. 17/124,017, filed Dec. 16, 2020, and entitled "Embedded Stressors in Epitaxy Source/drain Regions," which applications are hereby incorporated herein by reference.

BACKGROUND

In the formation of Fin Field-Effect Transistors, source/drain regions were typically formed by forming semiconductor fins, recessing semiconductor fins to form recesses, and growing epitaxy regions starting from the recesses. The epitaxy regions grown from the recesses of neighboring semiconductor fins may merge with each other, and the resulting epitaxy regions may have planar top surfaces. The source/drain contact plugs are formed to electrically connect to the source/drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
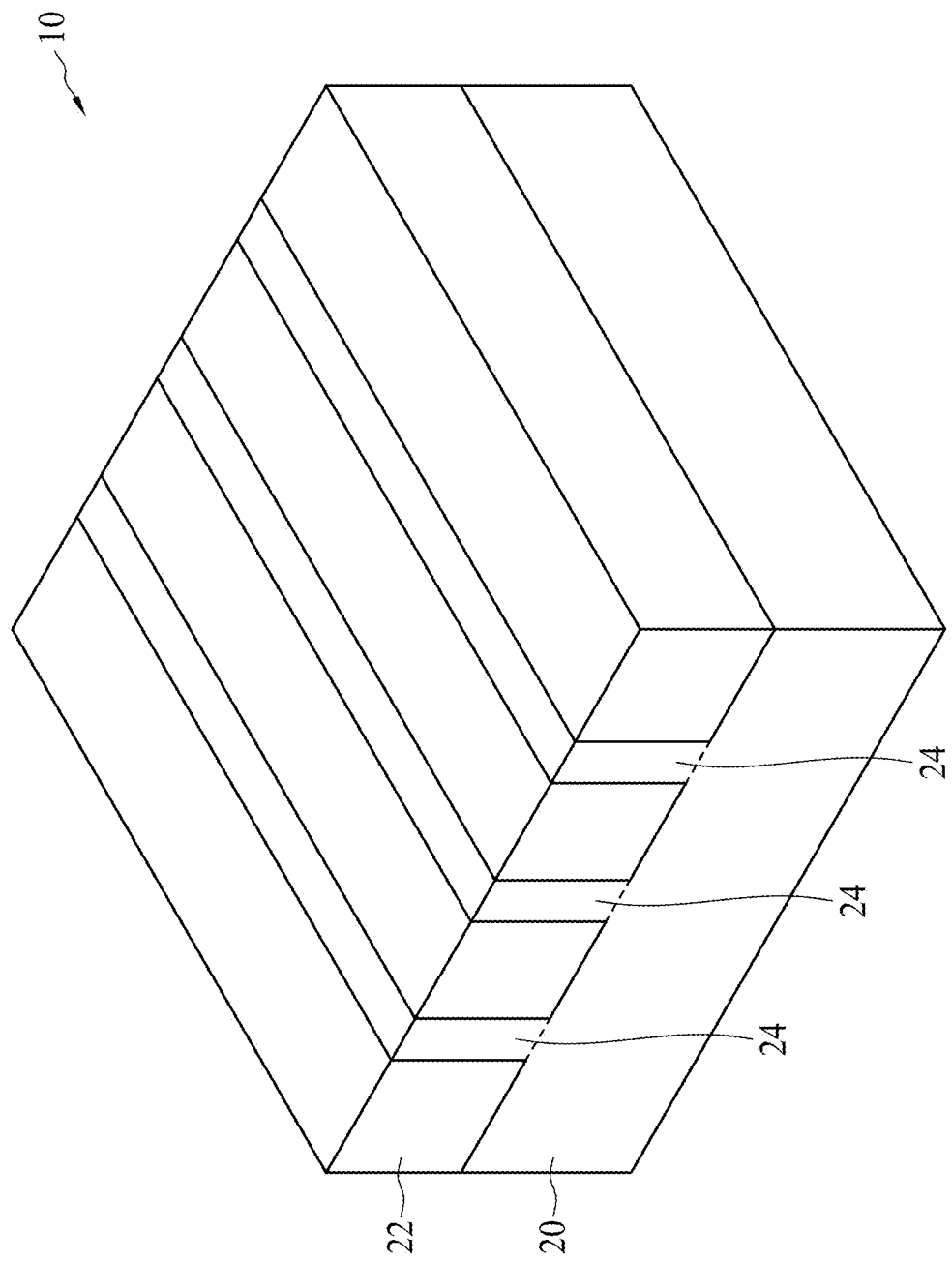
FIGS. 1, 2, 3A, 3B, 3C, 4A, 4B, 4C, 5A, 5B, 6A, 6B, 7A, 7B, 8A, 8B, 8C, 9A, 9B, 10A, 10B, 11A, 11B, and 11C illustrate the perspective views and cross-sectional views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the method of forming the same are provided. In accordance with some embodiments of the present disclosure, a source/drain region of a FinFET is formed to extend to a level lower than the top surfaces of Shallow Trench Isolation (STI) regions that are on opposing sides of the source/drain region. The short channel effect is thus reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 16:
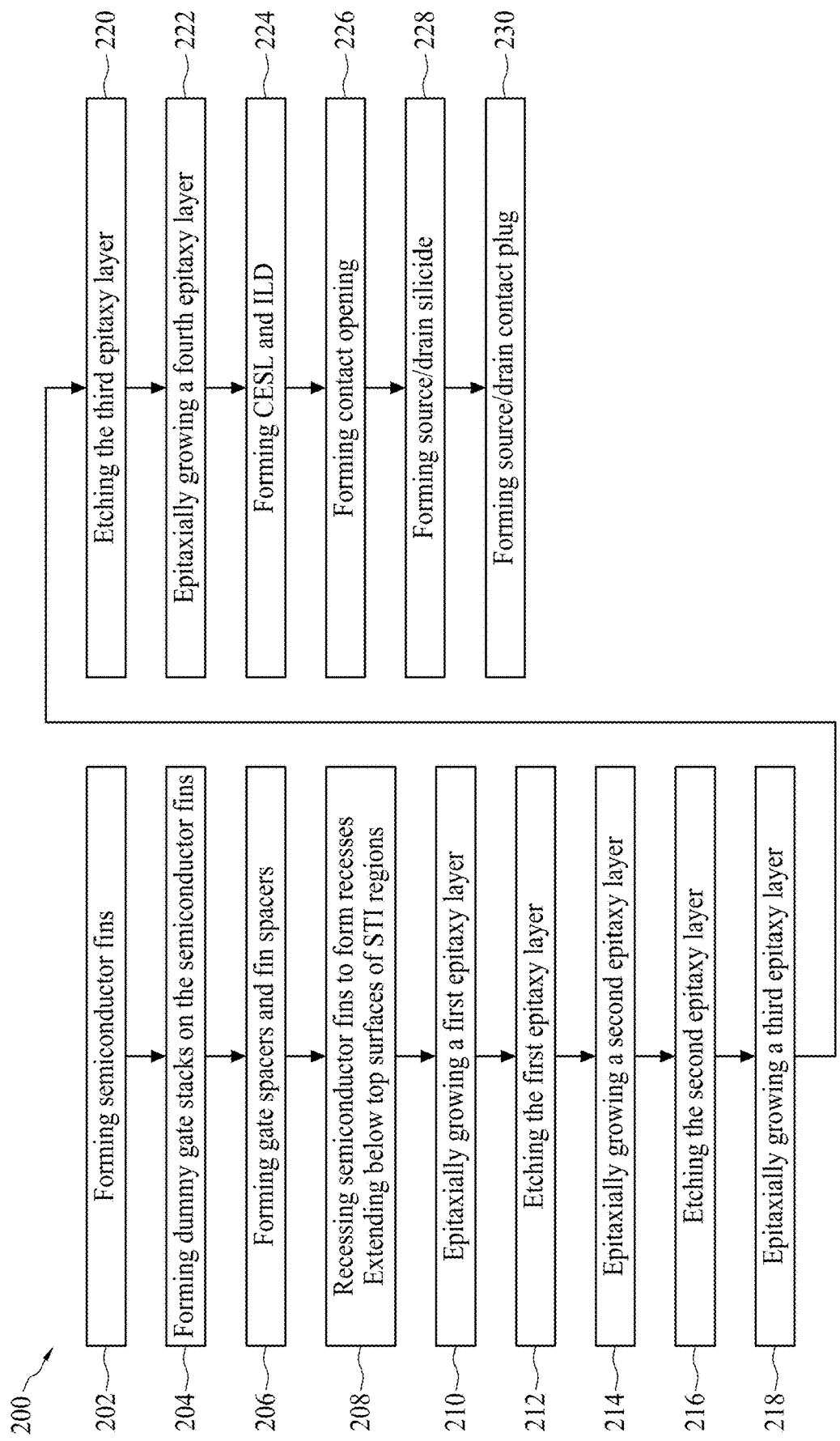
FIG. 16 illustrates a process flow for forming a FinFET in accordance with some embodiments.

FIGS. 1, 2, 3A, 3B, 3C, 4A, 4B, 4C, 5A, 5B, 6A, 6B, 7A, 7B, 8A, 8B, 8C, 9A, 9B, 10A, 10B, 11A, 11B, and 11C illustrate the perspective views and cross-sectional views of intermediate stages in the formation of a FinFET in accordance with some embodiments of the present disclosure. The corresponding processes are also reflected schematically in the process flow 200 shown in FIG. 16.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. The top surface of substrate 20 may be on a (100) surface plane. Substrate 20 may be doped with a p-type or an n-type impurity. Isolation regions 22 such as Shallow Trench Isolation (STI) regions may be formed to extend from a top surface of substrate 20 into substrate 20. The portions of substrate 20 between neighboring STI regions 22 are referred to as semiconductor strips 24. The top surfaces of semiconductor strips 24 and the top surfaces of STI regions 22 may be substantially level with each other in accordance with some embodiments.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

In accordance with some embodiments, semiconductor strips 24 are formed of a same material as the underlying bulk portions of semiconductor substrate 24. For example, when an n-type FinFET is to be formed, the corresponding semiconductor strips 24 may be a part of the original substrate 20, and may comprise the same material (such as silicon) as the underlying bulk portions of semiconductor substrate 24. When a p-type FinFET is to be formed, the corresponding semiconductor strips 24 may be formed of silicon germanium (SiGe), germanium, or the like, and may be different from the underlying bulk portions of semiconductor substrate 24, which may comprise silicon and free from germanium. The formation of the corresponding structure may include optionally recessing a portion of substrate 20 in a part of wafer 10 (such as in the regions for forming p-type FinFETs), performing an epitaxy process to grow an epitaxy layer, which may be formed of or comprise SiGe or germanium, on the recessed parts of the substrate, and then forming STI regions 22 extending into the epitaxy SiGe/Ge layer.

Figure 2:
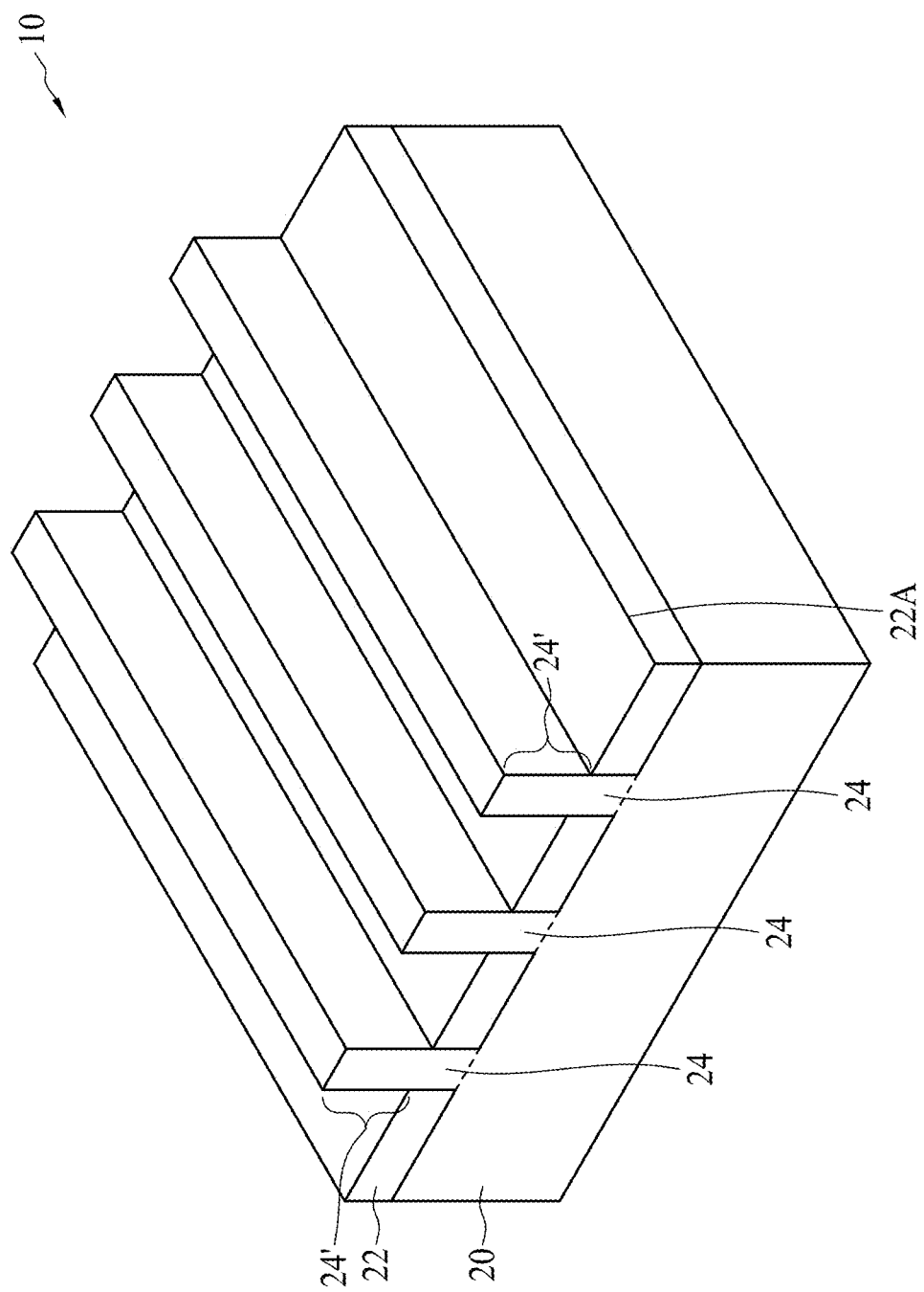

Referring to FIG. 2, STI regions 22 are recessed, so that the top portions of semiconductor strips 24 protrude higher than the top surfaces 22A of STI regions 22 to form protruding fins 24'. The respective process is illustrated as process 202 in the process flow 200 shown in FIG. 16. The portions of semiconductor strips 24 in STI regions 22 are still referred to as semiconductor strips 24. The etching may be performed using a dry etching process, wherein a mixture of HF and NH$_3$ may be used as the etching gases. The etching may also be performed using a mixture of NF$_3$ and NH$_3$ as the etching gases. During the etching process, plasma may be generated. Argon may also be included. In accordance with alternative embodiments of the present disclosure, the recessing of STI regions 22 is performed using a wet etching process. The etching chemical may include HF solution, for example.

In accordance with some embodiments, the fins for forming the FinFETs may be formed/patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3A:
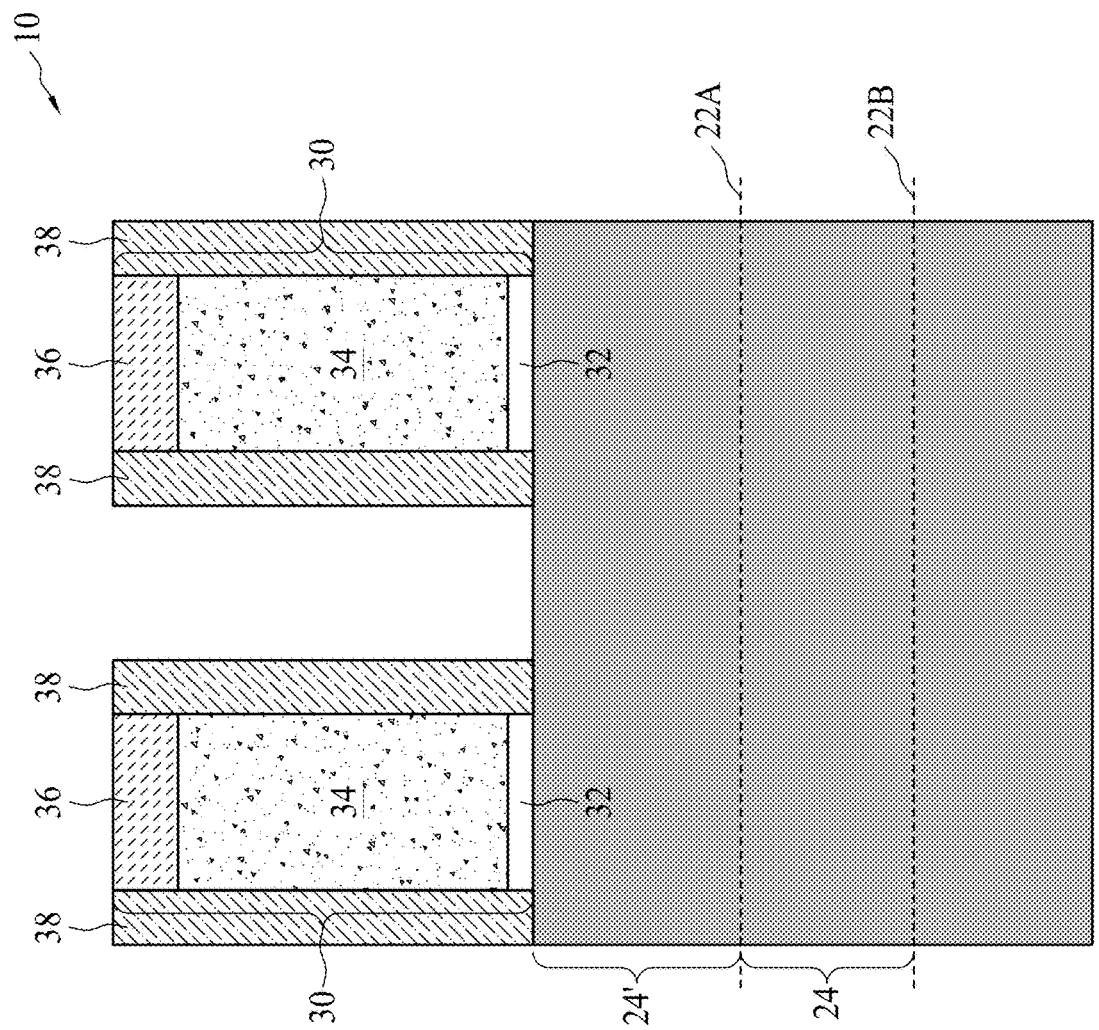
Figure 3B:
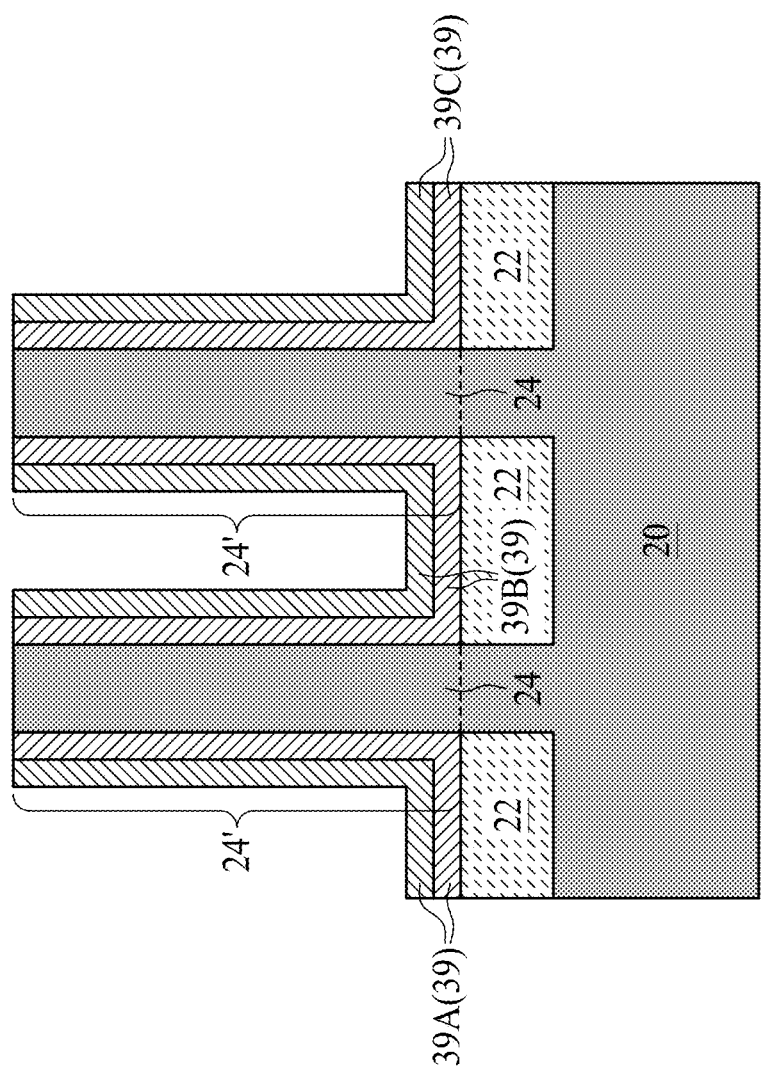
Figure 3C:
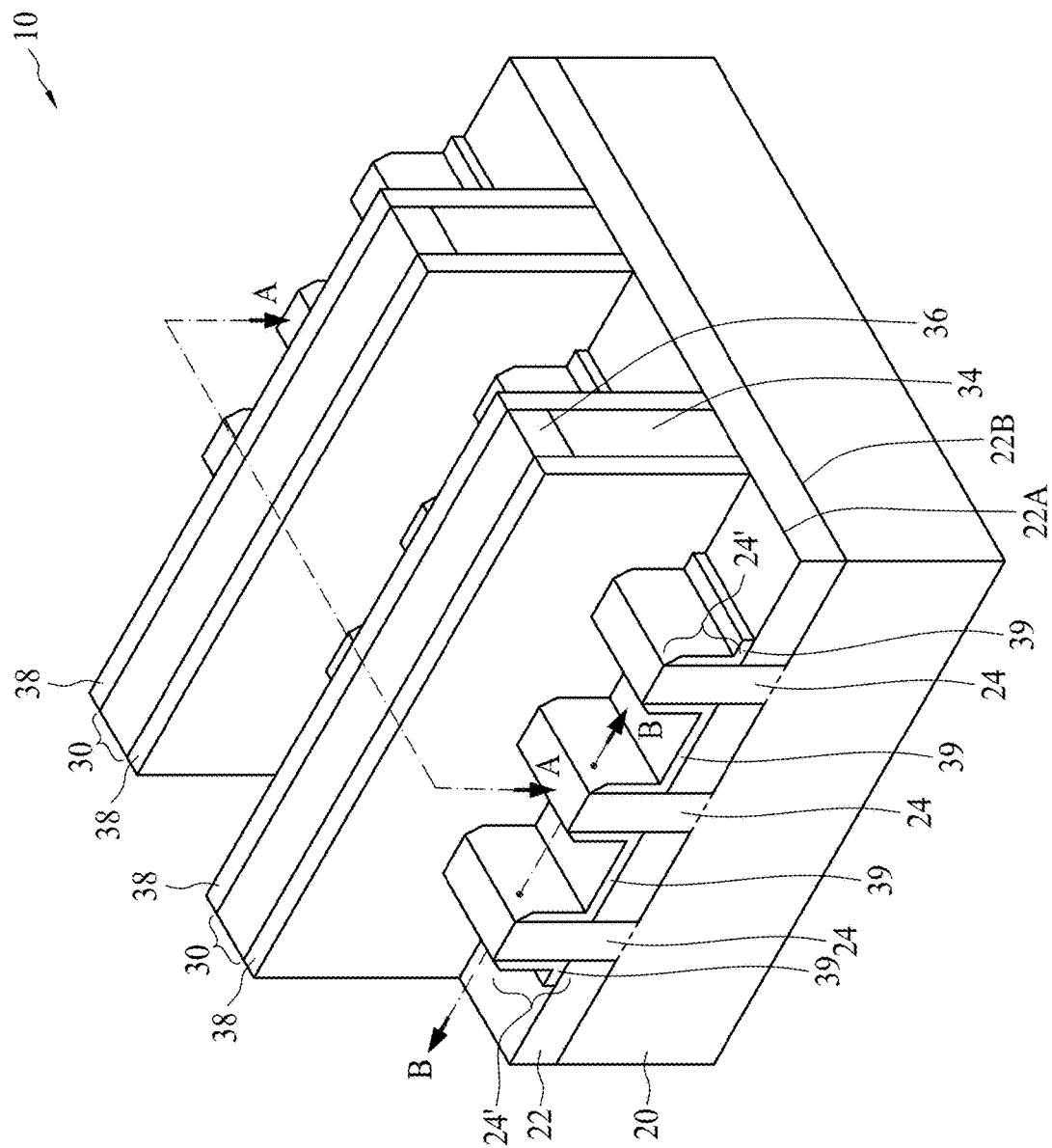

Referring to FIGS. 3A, 3B, and 3C, dummy gate stacks 30 are formed on the top surfaces and the sidewalls of protruding fins 24'. The respective process is illustrated as process 204 in the process flow 200 shown in FIG. 16. In accordance with some embodiments, a fin group for forming a FinFET may include a plurality of fins tightly grouped together. For example, the example shown in FIG. 3B illustrates a 2-fin group, and the example shown in FIG. 3C illustrates a 3-fin group. The fins in the same fin group may have spacings smaller than the spacings between neighboring fin groups.

The cross-sectional view shown in FIG. 3A is obtained from the vertical reference cross-section A-A in FIG. 3C, and the vertical cross-sectional view shown in FIG. 3B is obtained from the vertical reference cross-section B-B in FIG. 3C. It is appreciated that although two dummy gate stacks 30 are illustrated for clarity, there may be more dummy gate stacks formed, which are parallel to each other, with the plurality of dummy gate stacks crossing the same semiconductor fin(s) 24'. Dummy gate stacks 30 may include dummy gate dielectrics 32 (FIG. 3A) and dummy gate electrodes 34 over dummy gate dielectrics 32. Dummy gate electrodes 34 may be formed using, for example, amorphous silicon or polysilicon, and other materials may also be used. Each of dummy gate stacks 30 may also include one (or a plurality of) hard mask layer 36 over dummy gate electrode 34. Hard mask layers 36 may be formed of silicon nitride, silicon carbo-nitride, silicon oxy-carbo-nitride, or the like. Dummy gate stacks 30 also have lengthwise directions perpendicular to the lengthwise directions of protruding fins 24'.

Next, gate spacers 38 (FIGS. 3A and 3C) are formed on the sidewalls of dummy gate stacks 30. The respective process is illustrated as process 206 in the process flow 200 shown in FIG. 16. In accordance with some embodiments of the present disclosure, gate spacers 38 are formed of dielectric materials such as silicon carbon-oxynitride (SiCN), silicon oxy-carbon-oxynitride (SiOCN), silicon nitride, or the like, and may have a single-layer structure or a multi-layer structure including a plurality of dielectric layers. In accordance with some embodiments, gate spacers 38 (and fin spacers 39 (FIGS. 3B and 4B) include a silicon nitride layer and a SiOCN layer on the silicon nitride layer.

FIG. 3B also illustrates fin spacers 39 formed on the sidewalls of protruding fins 24'. The respective process is also illustrated as process 206 in the process flow 200 shown in FIG. 16. In accordance with some embodiments of the present disclosure, fin spacers 39 are formed by the same processes for forming gate spacers 38. For example, in the process for forming gate spacers 38, the blanket dielectric layer(s) that are deposited for forming gate spacers 38, when etched, may have some portions left on the sidewalls of protruding fins 24', hence forming fin spacers 39. In accordance with some embodiments, the fin spacers 39 include outer fin spacers such as fin spacer 39A, which is on the outer side of the outmost fin in the fin group. The fin spacers 39 further include inner fin spacers such as fin spacer 39B, with the inner fin spacer being between the fins 24' in the same fin group. Fin spacer 39C may be an inner fin spacer or an outer fin spacer, depending on whether the fin spacer has another fin on the right side of fin spacer 39C (and in the same fin group) or not. The illustrated fin spacer 39C shows an inner spacer as an example.

In FIG. 3A and subsequent figures that illustrate cross-sectional views, the level of the top surfaces 22A of STI regions 22 (FIG. 3A) are illustrated, and semiconductor fin 24' is higher than top surfaces 22A. Bottom surfaces 22B (FIG. 3A) of STI regions 22 are also illustrated in the cross-sectional views. STI regions 22 are locate at the level between 22A and 22B, and are not shown in FIG. 3A since they are in different planes than illustrated.

Figure 4A:
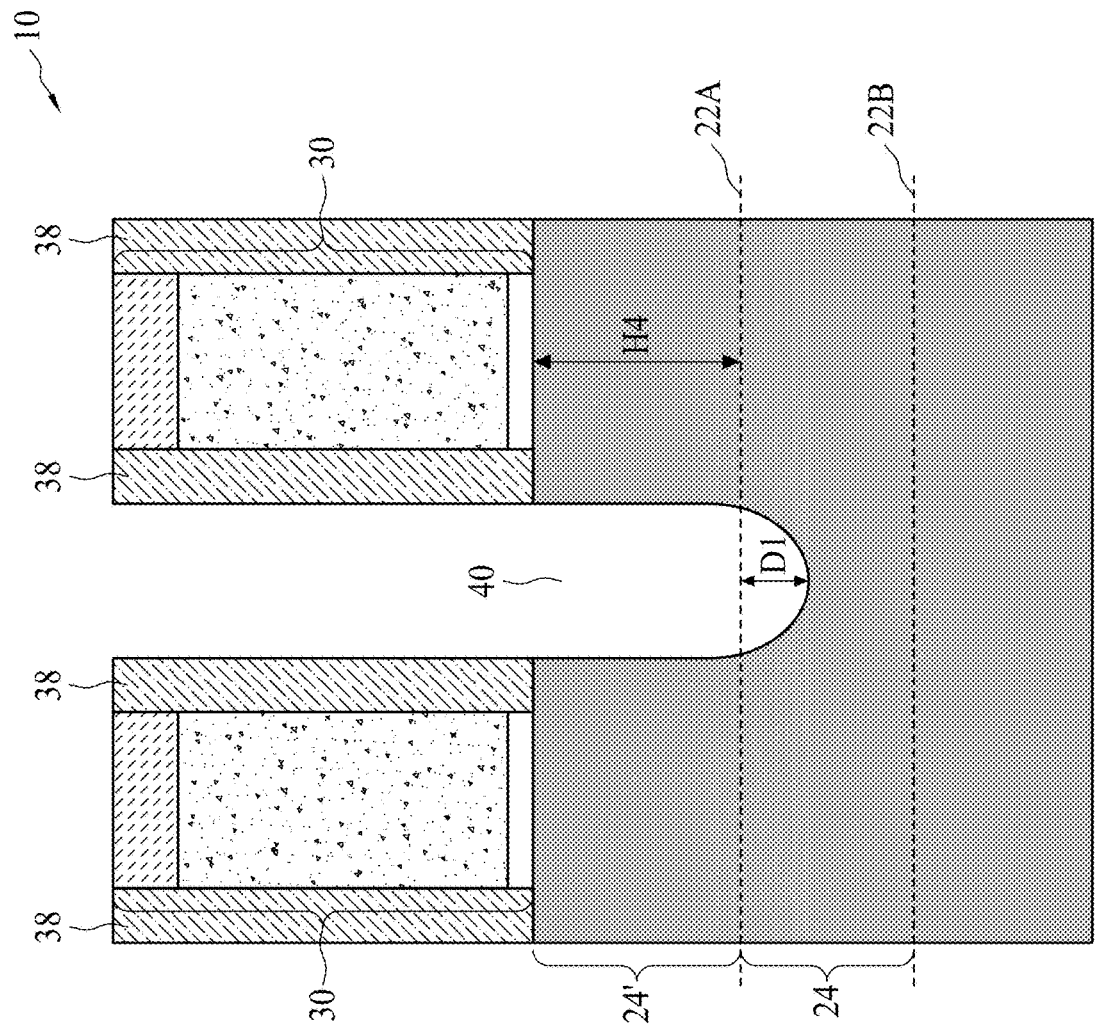
Figure 4B:
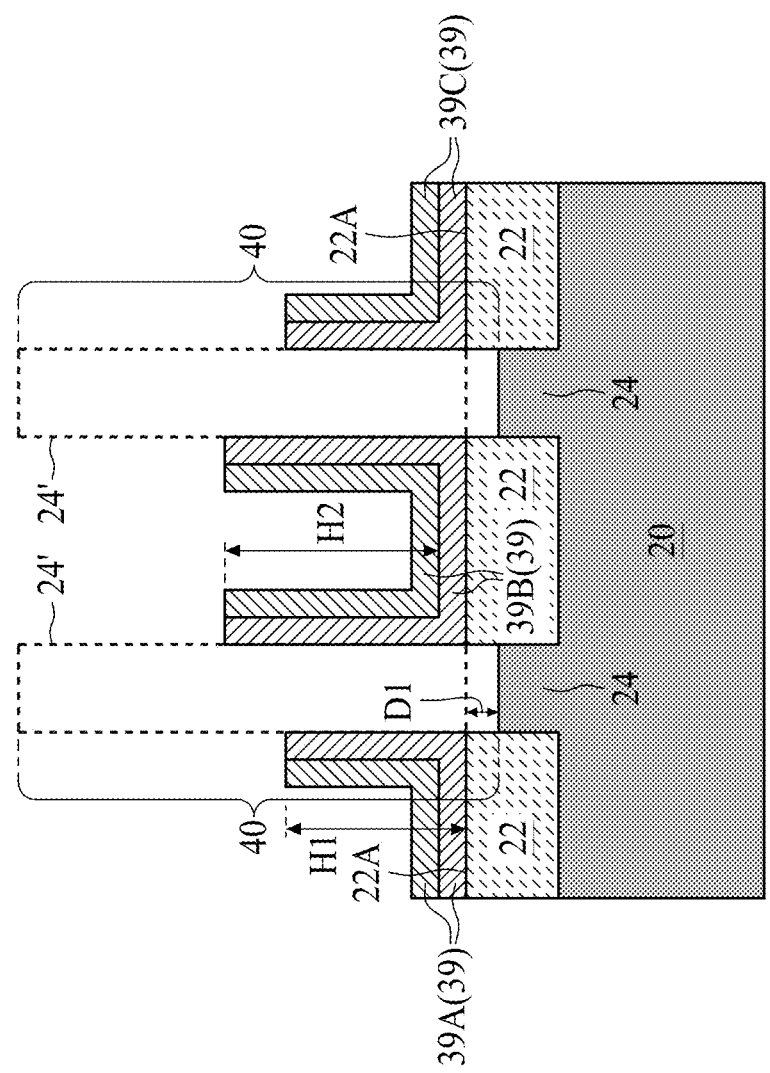
Figure 4C:
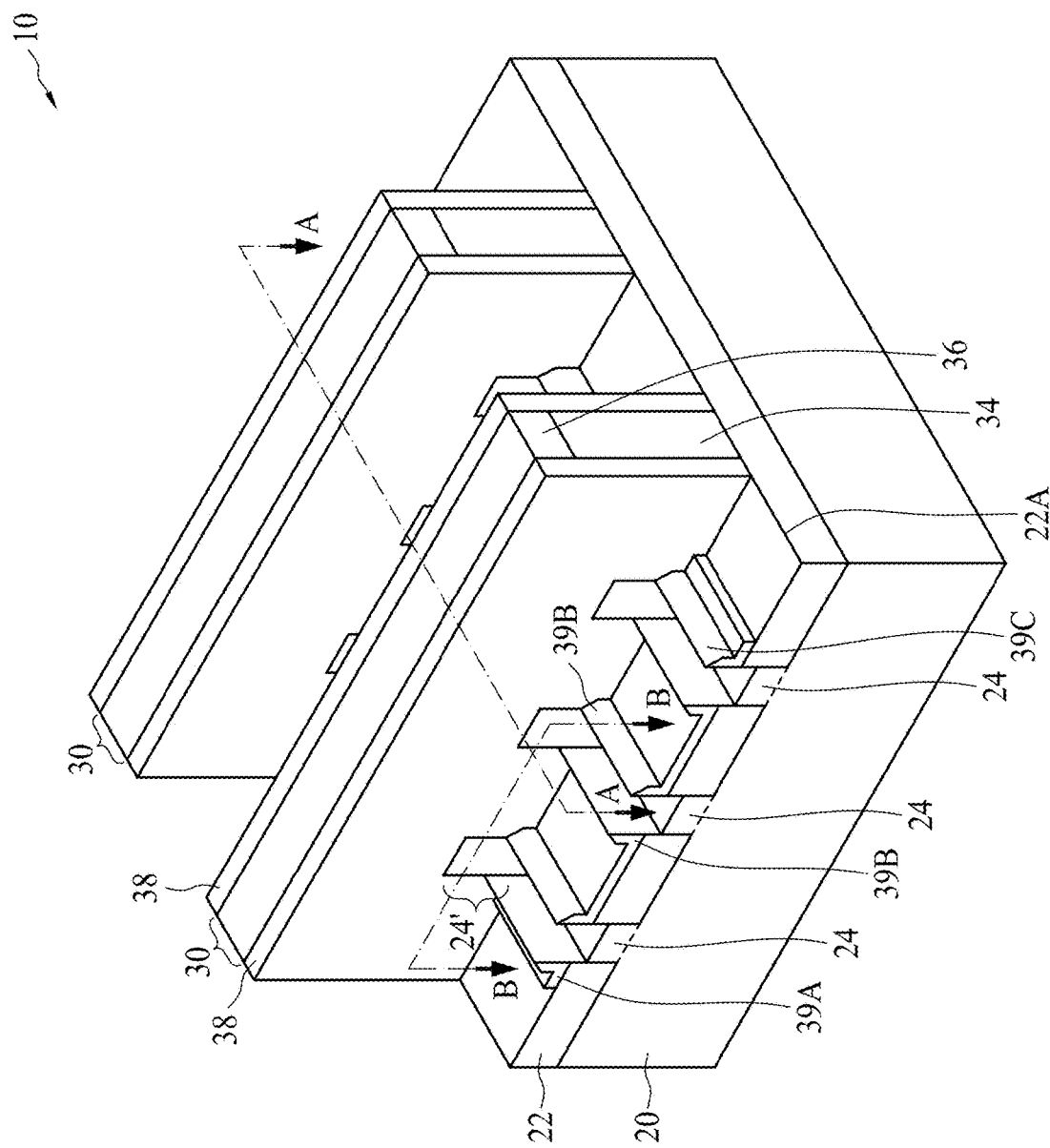

Referring to FIGS. 4A, 4B, and 4C, an etching process (also referred to as a source/drain recessing process hereinafter) is performed to recess the portions of protruding fins 24' that are not covered by dummy gate stacks 30 and gate spacers 38. Recesses 40 are thus formed. The respective process is illustrated as process 208 in the process flow 200 shown in FIG. 16. FIGS. 4A and 4B illustrate the cross-sectional views obtained from reference cross-sections A-A and B-B, respectively, in FIG. 4C. The recessing may be anisotropic, and hence the portions of fins 24' directly underlying dummy gate stacks 30 and gate spacers 38 are protected, and are not etched. The top surfaces of the recessed semiconductor fins 24' may be higher than the top surfaces 22A of STI regions 22 in accordance with some embodiments. Recesses 40 are also located on opposite sides of dummy gate stacks 30, as shown in FIG. 3C.

In accordance with some embodiments, during the etching of protruding fins 24', fin spacers 39 are also etched, so that the heights of the outer spacer 39A and inner spacer 39B are reduced. Fin spacers 39 thus have heights H1 and H2 (FIG. 4B) as shown in FIG. 3B. Heights H1 and H2 may be equal to or different from each other. The etching of fin spacers 39 may be performed at the same time fins 24' are recessed, with an etching gas(es) for etching fin spacers 39 added into the etching gas for recessing protruding fins 24'. The etching of fin spacers 39 may also be performed after fins 24' are recessed to adjust the heights of fin spacers 39, with an etching gas attacking fin spacers 39 (but does not etch protruding fins 24') being used. The adjustment of the heights of the fin spacers 39 may be performed through an anisotropic etching process.

In accordance with some embodiments of the present disclosure, the recessing of protruding fins 24' is performed through a dry etching process. The dry etching may be performed using process gases such as $C_2F_6$, $CF_4$, $SO_2$, the mixture of HF and ozone (followed by diluted HF), the mixture of HBr, $Cl_2$, and $O_2$, the mixture of HBr, $Cl_2$, $O_2$, and $CF_2$ etc., or the like. The etching may be anisotropic. In accordance with some embodiments of the present disclosure, as shown in FIG. 4A, the sidewalls of protruding fins 24' facing recess 40 are substantially vertical, and are substantially flush with the outer sidewalls of gate spacers 38. The sidewalls of protruding fins 24' facing recess 40 may be on (110) surface planes of semiconductor substrate 20. Referring to FIG. 4B, the location of recesses 40, which are also the removed portions of protruding fins 24', are shown. In FIG. 4B, dash lines are also drawn to represent protruding fins 24' that are directly underlying dummy gate stacks 30 (FIG. 4C), which are in a plane different than the illustrated plane.

In accordance with some embodiments, the bottoms of recesses 40 are lower than the top surfaces 22A of STI regions 22. As, shown in FIG. 4A, the depths D1 of the portions of recesses 40 lower than top surfaces 22A may be in the range between about 5 percent and about 15 percent height H4 of protruding fins 24'. In accordance with some embodiments, depth D1 is in the range between about 0.5 nm and about 20 nm.

FIGS. 5A, 5B, 6A, 6B, 7A, 7B, 8A, and 8B illustrate the processes for depositing epitaxy region(s) 42. In these figures and subsequent figures, figure numbers may be followed by a letter A or B, wherein letter A indicates that the corresponding cross-sectional view is obtained from a reference plane same as the reference plane A-A in FIG. 4C, and letter B indicates that the corresponding cross-sectional view is obtained from a plane same as the reference plane B-B in FIG. 4C. In the subsequent discussion, the dopants and the corresponding dopant concentrations of an n-type FinFET are discussed as an example. The dopants and the corresponding dopant concentrations of a p-type FinFET are discussed in the discussion of FIG. 12.

Figure 5A:
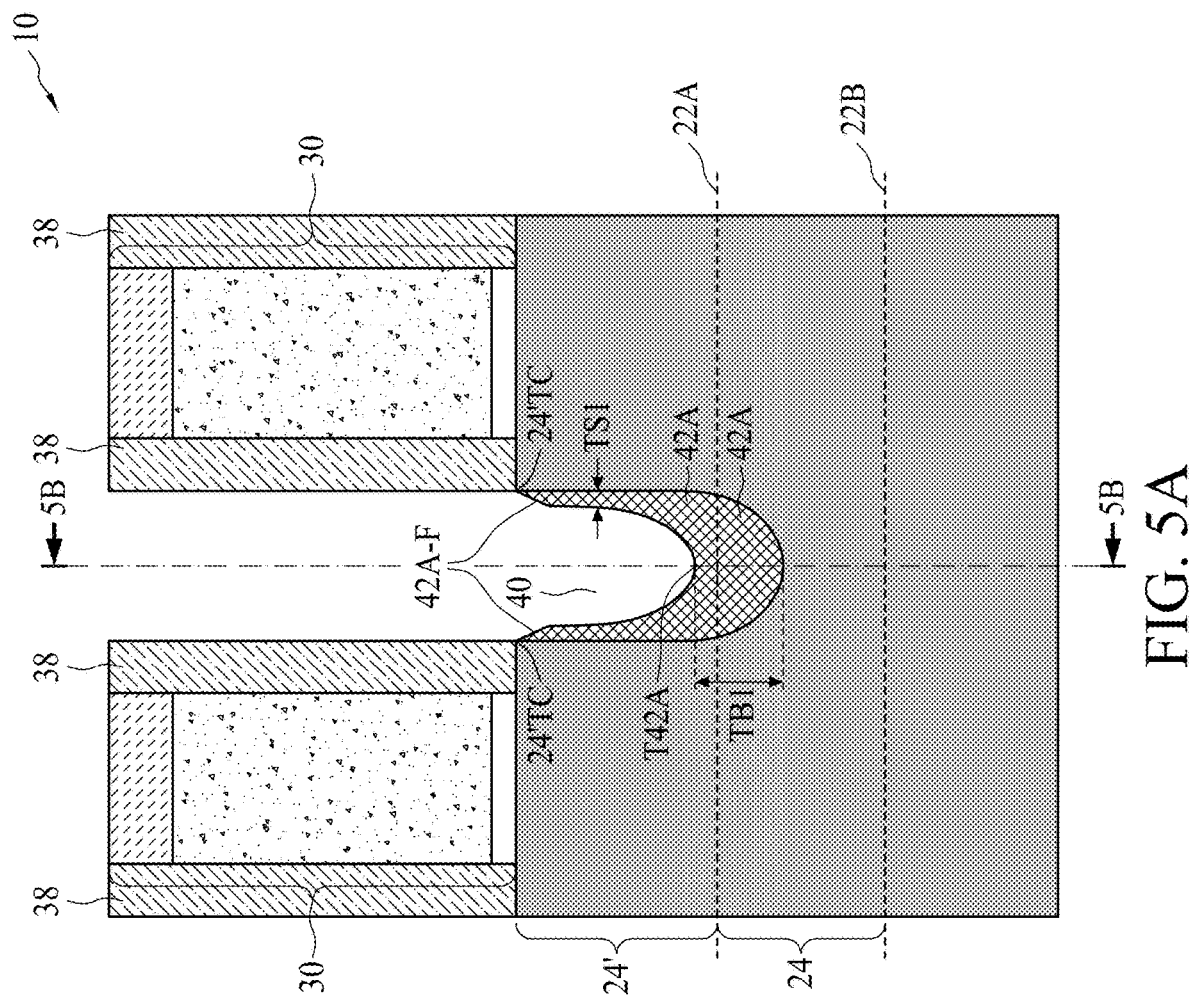
Figure 5B:
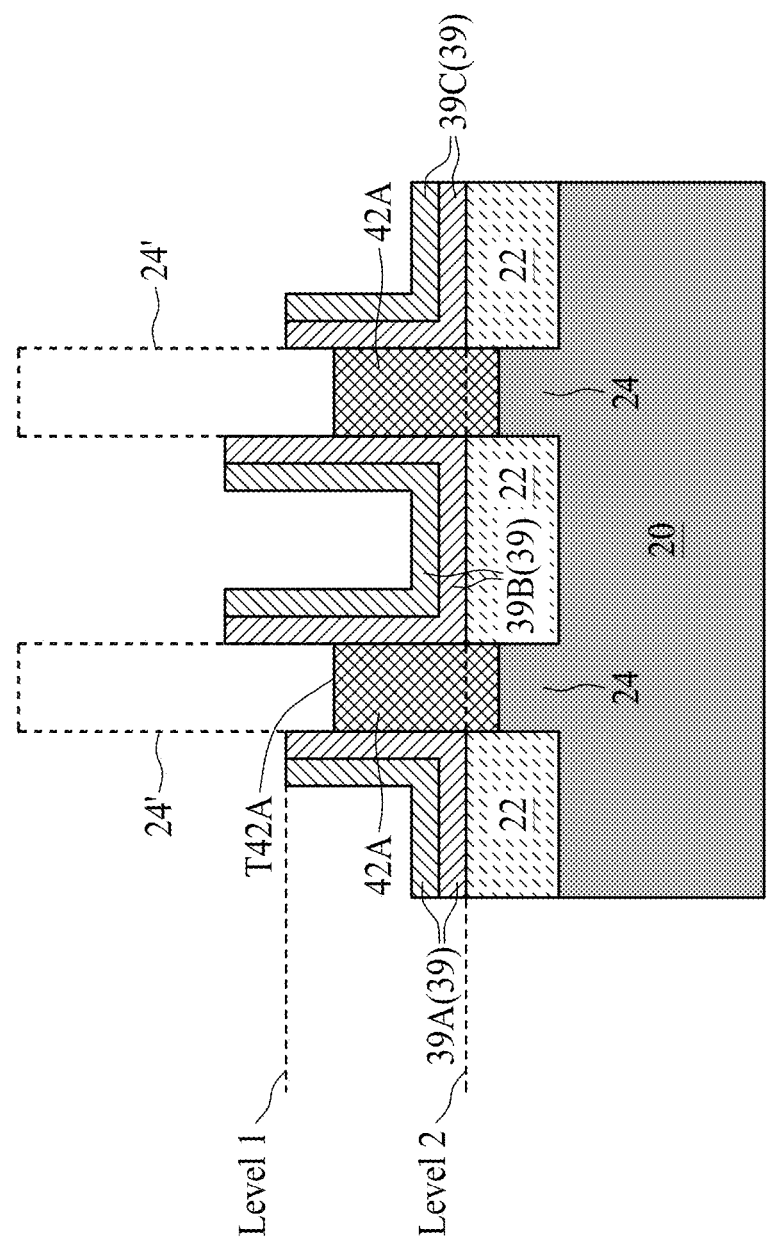

Referring to FIGS. 5A and 5B, a first epitaxy layer 42A (which is also referred to as epitaxy layer L1) of an epitaxy region is deposited through an epitaxy process. The respective process is illustrated as process 210 in the process flow 200 shown in FIG. 16. In accordance with some embodiments, the deposition is performed through a non-conformal deposition process, so that the bottom portion of first layer 42A is thicker than the sidewall portions. This is incurred by allowing the growth on the (100) surface of semiconductor substrate 20 to be faster than on the (110) surface. For example, the ratio of the bottom thickness TB1 to the sidewall thickness TS1 may be in the range between about 1.5 and about 4. The deposition may be performed using Reduced pressure Chemical Vapor Deposition (RPCVD), Plasma Enhanced Chemical Vapor Deposition (PECVD), or the like. In accordance with some embodiments, epitaxy layer 42A is formed of or comprises SiAs. In accordance with alternative embodiments, epitaxy layer 42A is formed of or comprises SiP. In accordance with yet alternative embodiments, epitaxy layer 42A is formed of or comprises a SiAs layer and a SiP layer over the SiAs layer. The process gas for depositing epitaxy layer 42A may include a silicon-containing gas such as silane, disilane ($Si_2H_6$), dicholorosilane (DCS), or the like, and a dopant-containing process gas such as $PH_3$, $AsH_3$, or the like, depending on the desirable composition of epitaxy layer 42A. The chamber pressure may be in the range between about 100 Torr and about 300 Torr. Epitaxy layer 42A may have a first doping concentration (such as P) in the range between about $1\times10^{20}/cm^3$ and about $8\times10^{20}/cm^3$. Epitaxy layer 42A may also have a first doping concentration (As) in the range between about $1\times10^{20}/cm^3$ and about $1\times10^{21}/cm^3$ when As is incorporated.

An etching gas such as HCl is added into the process gases to achieve selective deposition on semiconductor, but not on dielectric. Carrier gas(es) such as $H_2$ and/or $N_2$ may also be included in the process gas, for example, with a flow rate in the range between about 50 sccm and about 500 sccm. In accordance with some embodiments, a top surface T42A of a portion of the first epitaxy layer 42A in the middle between two neighboring gate stacks 30, which top surface T42A may be the lowest point in the illustrated cross-section, may be lower than, level with, or higher than, the top surfaces 22A of STI regions 22. Correspondingly, in FIG. 5B, top surface T42A may be at any level between level 1 and level 2, wherein level 1 is the level of the top ends of fin spacers 39, and level 2 is the top surface level of STI regions 22.

After the epitaxy process for depositing epitaxy layer 42A, an etching (back) process is performed. The respective process is illustrated as process 212 in the process flow 200 shown in FIG. 16. In accordance with some embodiments of the present disclosure, the etching-back is isotropic. The etching process may be performed using an etching gas such as HCl and a carrier gas(es) such as $H_2$ and/or $N_2$. The preceding deposition process and the subsequent etching back are optimized so that epitaxy layer 42A has a desirable thickness. For example, after the etching process, bottom thickness TB1 of epitaxy layer 42A may be in the range between about 5 nm and about 20 nm, and sidewall thickness TS1 (FIG. 5A) may be in the range between about 4 nm and about 10 nm. The deposition time and the etching time may be adjusted accordingly, for example, with the deposition process lasts for about 20 seconds and about 60 seconds, and the etching process lasts for about 5 seconds and about 20 seconds.

As a result of the etching process, as shown in FIG. 5A, facets 42A-F may be formed, and the facets 42A-F extend to the top corners 24'TC of protruding fins 24'. In accordance with some embodiments, facets 42A-F are on the (111) planes of epitaxy layer 42A. In accordance with other embodiments, facets 42A-F are steeper (more vertical) than the (111) planes of substrate 20.

FIG. 5B illustrates a cross-sectional view, wherein the bottom portions of epitaxy layers 42A are illustrated. The cross-sectional view shown in FIG. 5B is also obtained from the reference cross-section 5B-5B shown in FIG. 5A. In accordance with some embodiments, for example, when the corresponding FinFET is an n-type FinFET, the top surface of the bottom portion of epitaxy layer 42A is level with or lower than the top end of outer fin spacer 39A, and lower than the top ends of inner fin spacer 39B. In accordance with alternative embodiments, for example, when the corresponding FinFET is a p-type FinFET, the top surface of epitaxy layer 42A are higher than the top ends of outer fin spacer 39A and 39B. The corresponding structure is shown on the right side of FIGS. 12 and 13 as an example.

In subsequent FIGS. 6A, 6B, 7A, and 7B, two epitaxy layers 42B1 and 42B2 are formed, which have different atomic percentages of elements. In accordance with alternative embodiments, instead of forming two epitaxy layers, a single epitaxy layer 42B with uniform atomic percentages of elements is formed. Accordingly, instead of performing an etching back process for each of epitaxy layers 42B1 and 42B2, a single etching back process is performed after the epitaxy of epitaxy layer 42B.

Figure 6A:
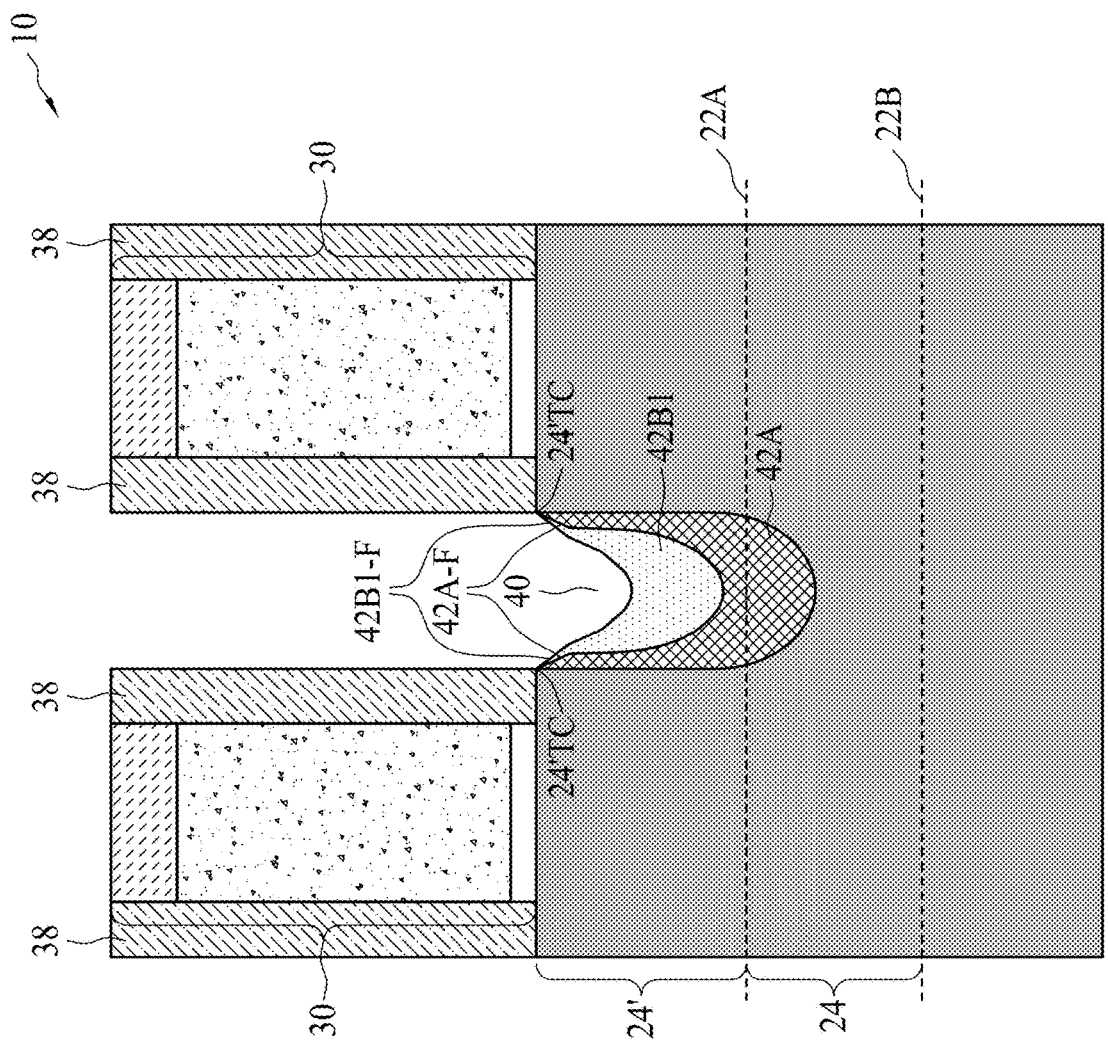
Figure 6B:
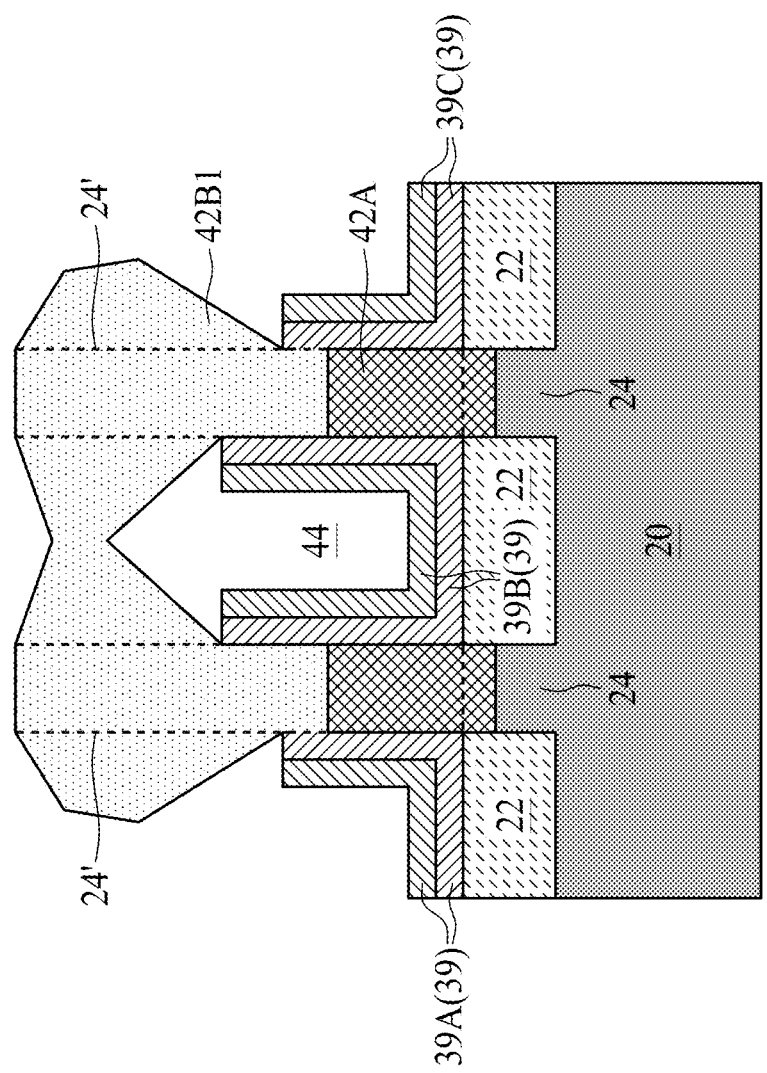

Referring to FIGS. 6A and 6B, a second epitaxy layer 42B1 (which is also referred to as epitaxy layer L21) is deposited. The respective process is illustrated as process 214 in the process flow 200 shown in FIG. 16. The deposition process may be performed using RPCVD, PECVD, or the like. An n-type dopant is added into epitaxy layer 42B1 when the corresponding FinFET is of n-type. In the discussion of epitaxy layers 42B1, 42B2, and 42C (FIG. 8A), phosphorous is discussed as an example of the n-type dopants, while other n-type dopants such as arsenic, antimony, or the like, or combinations thereof, may be used. In accordance with some embodiments, epitaxy layer 42B1 includes silicon phosphorous, with the phosphorous having a second phosphorous concentration higher than the first phosphorous concentration in epitaxy layers 42A. For example, the second phosphorous concentration in epitaxy layers 42B1 may be in the range between about $8 \times 10^{20}/cm^3$ and about $5 \times 10^{21}/cm^3$ in accordance with some embodiments. The second phosphorus concentration may be about one order or two orders higher than the first phosphorus concentration in epitaxy layers 42A. The process gas for forming epitaxy layer 42B1 may be similar to the process gases in the formation of epitaxy layer 42A, except the flow rates of the process gases may be different from the flow rates of the corresponding process gases in the formation of epitaxy layer 42A.

After the epitaxy to deposit epitaxy layer 42B1, an etching (back) process is performed. The respective process is illustrated as process 216 in the process flow 200 shown in FIG. 16. In accordance with some embodiments of the present disclosure, the etching process is isotropic. In accordance with some embodiments, the etching process is performed using an etching gas such as HCl, and a carrier gas(es) such as $H_2$ and/or $N_2$. In addition, a silicon-containing gas such as silane may be added in the etching gas. The addition of the silicon-containing gas results in a deposition effect, which occurs concurrently as the etching effect. The etching rate, however, is greater than the deposition rate, so that the net effect is the etching-back of epitaxy layer 42B1. The addition of the silicon-containing gas reduces the net etching rate, so that when the surface profile of epitaxy layer 42B1 is re-shaped, the thickness of epitaxy layer 42B1 is not reduced significantly. The deposition and the etching are optimized so that epitaxy layer 42B1 has a desirable thickness. As shown in FIG. 6A, the top surface of epitaxy layer 42B1 is re-shaped as having a V-shape by the etching process.

Referring to FIG. 6A again, the left top end of epitaxy layer 42B1 joins to the left top end of epitaxy layer 42A, with both top ends joining to the top end 24'TC of protruding fin 24' on their left side. Accordingly, the topmost points of epitaxy layer 42B1 and epitaxy layer 42A are level with the top surface of protruding fin 24'. Similarly, the right top end of epitaxy layer joins to the right top end of epitaxy layer 42A, with both top ends joining to the top end 24'TC of protruding fin 24' on their right side. Facets 42B1-F may be formed as a result of etching epitaxy layer 42B1. In accordance with some embodiments, facets 42A-F are on the (111) planes of the epitaxy material. In accordance with alternative embodiments, facets 42B1-F are on the (111) planes of the epitaxy material.

Referring to FIG. 6B, the epitaxy layer 42B1 grown from neighboring recesses are merged, with air gap 44 being sealed under epitaxy layer 42B1. The top surface of the merged epitaxy layer 42B1 may have a non-planar profile (also referred to as having a wavy shape), with the middle portion between neighboring fins being lower than the portions on its opposite sides. Also, as shown in both of FIGS. 6A and 6B, the top ends of the top surfaces of epitaxy layer 42B1 are controlled to be leveled with the top surface of protruding fins 24'.

Figure 7A:
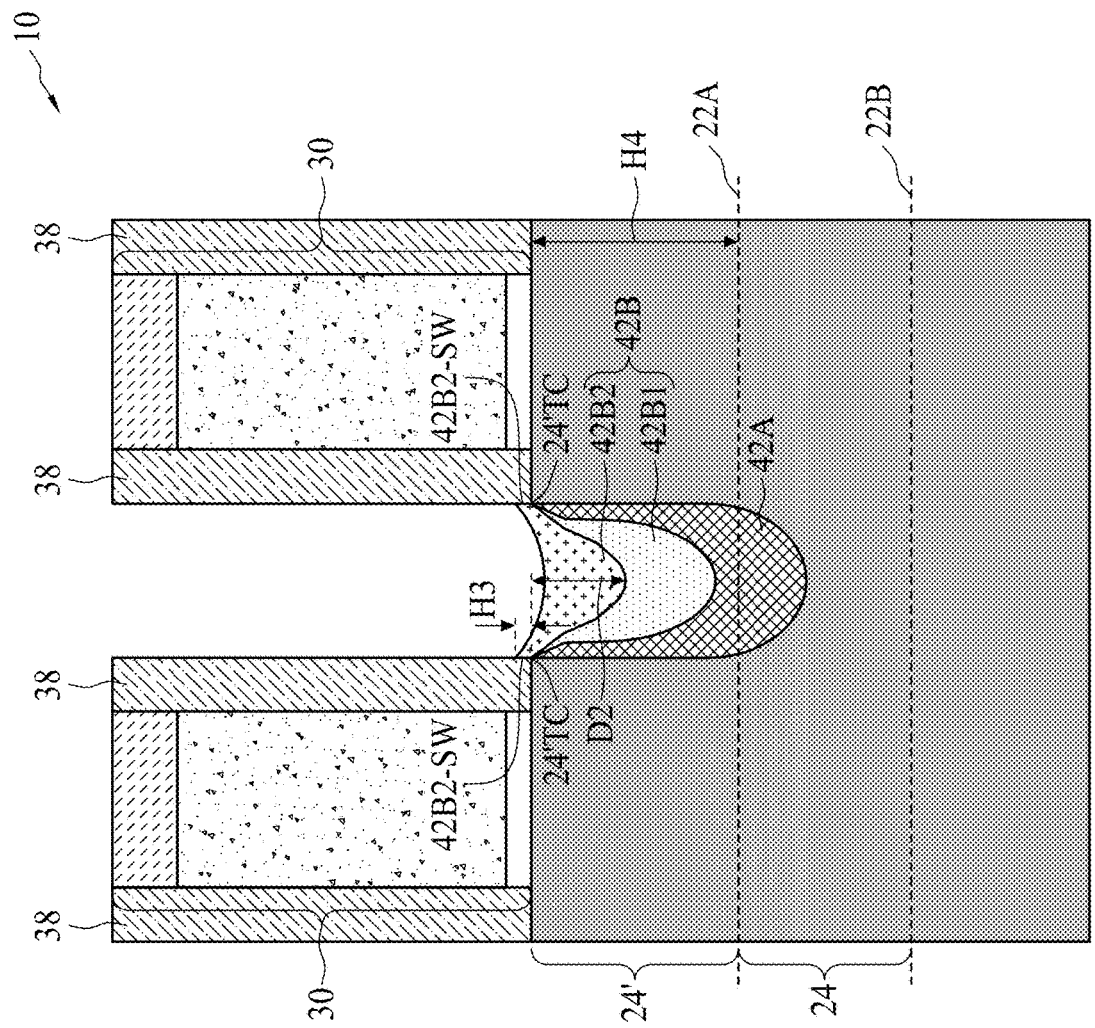
Figure 7B:
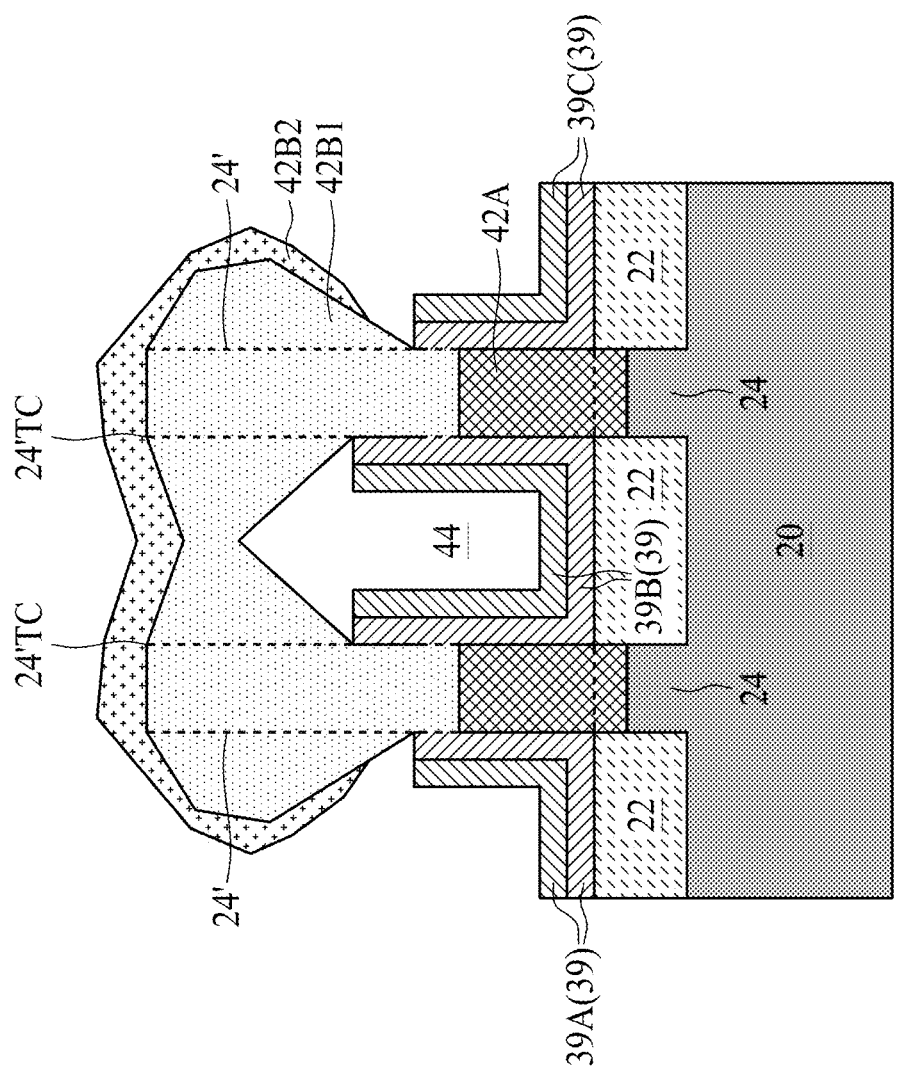

FIGS. 7A and 7B illustrate the epitaxy process for depositing a third epitaxy layer 42B2 (which is also referred to as epitaxy layer L22, with L21 and L22 collectively referred to as layer L2). The respective process is illustrated as process 218 in the process flow 200 shown in FIG. 16. As shown in FIG. 7B, the top surface of epitaxy layer 42B2 has the wavy shape. The deposition process may be performed using RPCVD, PECVD, or the like. In accordance with some embodiments, epitaxy layer 42B2 includes silicon phosphorous, with the phosphorous having a third phosphorous concentration higher than the second phosphorous concentration in epitaxy layers 42B1. Furthermore, epitaxy layer 42B2 has the highest phosphorous concentration in the resulting source/drain region. For example, the third phosphorous concentration in epitaxy layers 42B2 may be in the range between about $2 \times 10^{21}/cm^3$ and about $5 \times 10^{21}/cm^3$ in accordance with some embodiments. The ratio of the third phosphorus concentration to the second phosphorus concentration of epitaxy layer 42B1 may be in the range between about 3 and about 6. The process gases for forming epitaxy layer 42B2 may be similar to the process gases in the formation of epitaxy layer 42B1, except the flow rates are adjusted to achieve the desirable concentrations.

After the epitaxy process for depositing epitaxy layer 42B2, an etching process is performed. The respective process is illustrated as process 220 in the process flow 200 shown in FIG. 16. In accordance with some embodiments of the present disclosure, the etching is isotropic. In accordance with some embodiments, the etching process is performed using an etching gas such as HCl and a carrier gas(es) such as $H_2$ and/or $N_2$. In addition, a silicon-containing gas such as silane may be added into the etching gas to deposit silicon. The etching process thus includes both of an etching effect and a deposition effect, with the net effect being etching. The addition of the silicon-containing gas reduces the etching rate, so that when the surface profile of epitaxy layer 42B2 is re-shaped, the thickness of epitaxy layer 42B2 is not reduced significantly.

With the topmost ends of epitaxy layer 42B1 being in contact with the top corners 24'TC of protruding fins 24', the top portions of epitaxy layer 42B2, which are over epitaxy layer 42B1, are higher than the top surfaces of protruding fins 24'. The sidewalls 42B2-SW (FIG. 7A) of the top portions of epitaxy layer 42B2 are thus in contact with the sidewalls of gate spacers 38. The sidewalls 42B2-SW are on the (110) surface planes of the semiconductor material of epitaxy layer 42B2.

Since the material and the lattice structure of epitaxy layer 42B2 are different from the material and the structure of gate spacers 38, a stress is generated and applied by gate spacers 38 on the resulting epitaxy layers. Epitaxy layer 42B2 is an embedded stressor embedded in the resulting source/drain region. The internal stress in epitaxy layer 42B2 is a tensile stress. As shown in FIG. 6A, at least a part of the stress is contributed by gate spacers 38, and the stress is increased due to that epitaxy layer 42B2 has a high doping concentration (of phosphorus, for example). The lower part of epitaxy layer 42B2 is lower than the top surfaces of protruding fins 24', and hence the stress is passed from the top portion of epitaxy layer 42B2, which top portion is higher than the top surfaces of protruding fins 24', to the lower/bottom portion of epitaxy layer 42B2, which lower/bottom portion is lower than the top surfaces of protruding fins 24'. Furthermore, both of the top surface and the bottom surface of epitaxy layer 42B2 may have the V-shapes, which may improve the efficiency in transferring stress from top portion to the bottom portion of epitaxy layer 42B2. Accordingly, the stress is also applied to the channel of the resulting FinFET, and hence improves the performance of the resulting FinFET. In addition, the internal stress in the resulting FinFET also results in the increase in the activation rate of the dopant (phosphorous, for example). To maximize the stress, the height H3 of sidewalls 42B2-SW is in a selected range. For example, height H3 is great enough to induce a high stress. On the other hand, a too-high height H3 results in the saturation of the stress, and may cause less stress to be passed to the lower portion of epitaxy layer 42B2. In accordance with some embodiments, height H3 is in the range between about 3 nm and about 15 nm.

Furthermore, the depth D2 (FIG. 7A) of epitaxy layer 42B2, which is the depth of epitaxy layer 42B2 below the top surfaces of protruding fins 24', is also in a selected range to maximize the stress received from the top part of epitaxy layer 42B2, and to maximize the effect of the stress. For example, depth D2 may be in the range between about 3 nm and about 15 nm. Furthermore, a ratio D2/H4 may be in the range between about 0.3 and about 0.5, wherein height H4 is the height of protruding fins 24'.

Figure 8A:
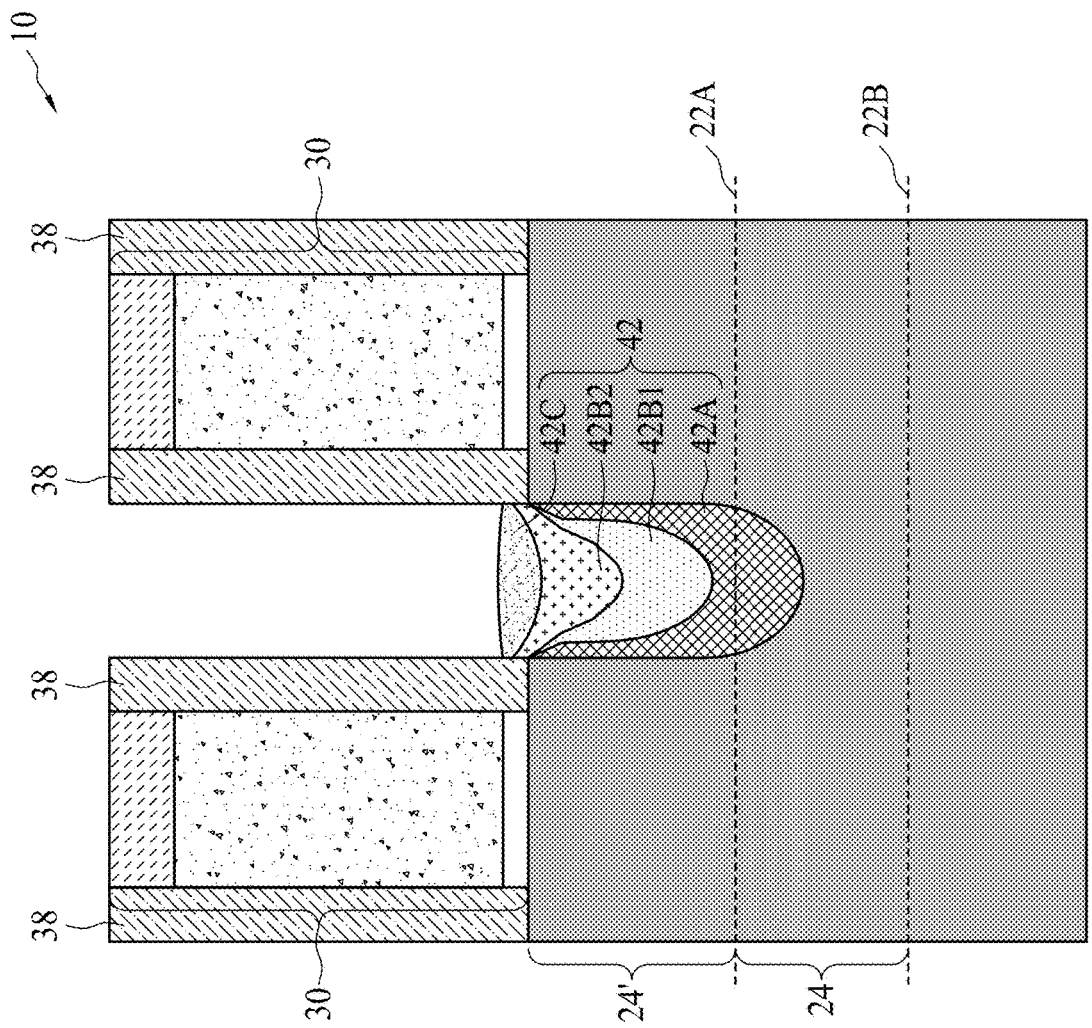
Figure 8B:
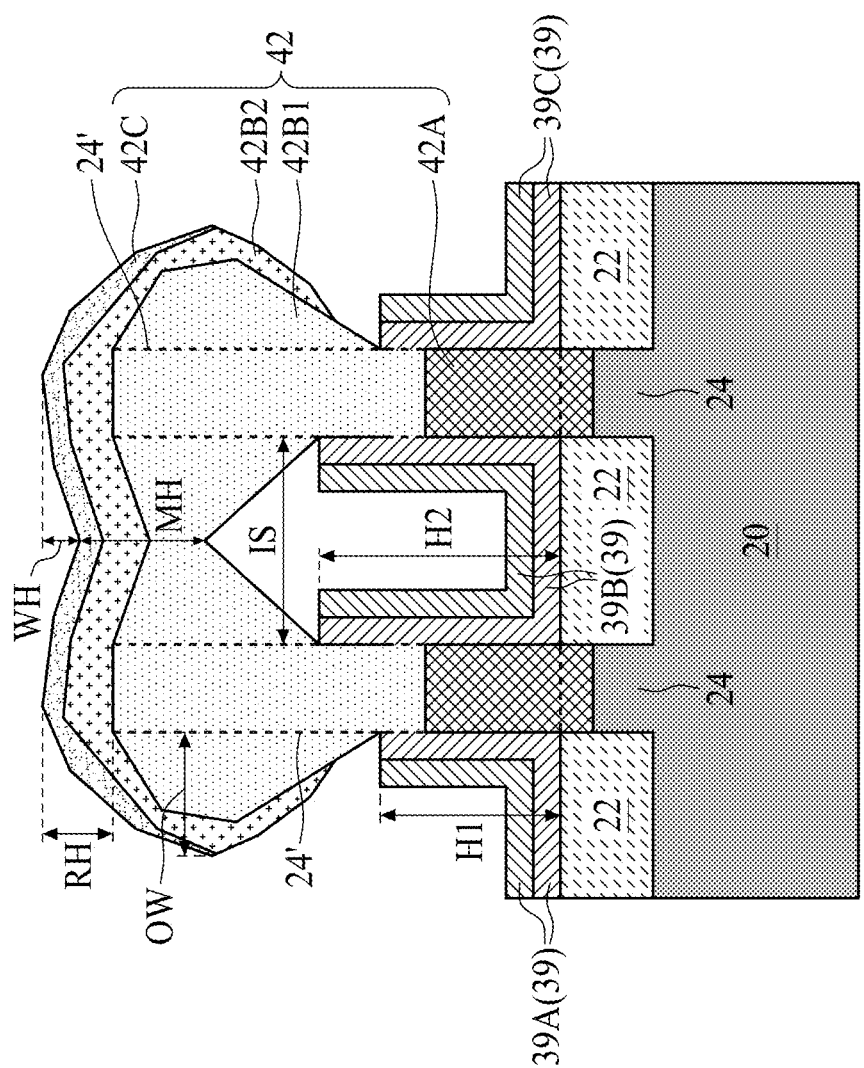

FIGS. 8A and 8B illustrate the epitaxy process for depositing a fourth epitaxy layer 42C (which is also referred to as epitaxy layer L3 or a capping layer). The respective process is illustrated as process 222 in the process flow 200 shown in FIG. 16. The deposition process may be performed using RPCVD, PECVD, or the like. The top surface of epitaxy layer 42C (FIG. 8B) maintains the wavy shape. In accordance with some embodiments, epitaxy layer 42C includes silicon phosphorous, with the phosphorous having a fourth phosphorous concentration lower than the phosphorous concentrations in epitaxy layers 42B2. In addition, germanium may be incorporated, for example, with a germanium atomic percentage in the range between about 1 percent and about 5 percent. In accordance with some embodiments, the phosphorous concentration in epitaxy layers 42C may be in the range between about $1 \times 10^{20}/cm^3$ and about $3 \times 10^{21}/cm^3$. The process gases for forming epitaxy layer 42C may be similar to the process gases in the formation of epitaxy layer 42B2, except a germanium-containing gas such as germane ($GeH_4$), digermane ($Ge_2H_6$), or the like may be added. Throughout the description, epitaxy layers 42A, 42B1, 42B2, and 42C are collectively and individually referred to as epitaxy layers 42, which are collectively referred to as source/drain regions 42 hereinafter. Source/drain regions 42 are also shown in FIG. 8C.

Referring to FIG. 8B, in accordance with some embodiments, wavy height WH may be in the range between about 5 nm and about 15 nm, wherein wavy height WH is measured from the topmost point of the top surface of epitaxy layer 42C to the lowest point of the top surface of epitaxy layer 42C, with the lowest point being in the middle between two neighboring fins. Merge height MH may be in the range between about 15 nm and about 35 nm. Outer width OW may be in the range between about 10 nm and about 20 nm. Inner spacing IS may be in the range between about 30 nm and about 45 nm. Raise height RH may be in the range between about 1 nm and about 10 nm. Height H1 of outer fin spacers 39A may be in the range between about 5 nm and about 15 nm. Height H2 of inner fin spacers 39B may be in the range between about 10 nm and about 30 nm. Ratio H2/H1 may be in the range between about 1 and about 3.

Figure 8C:
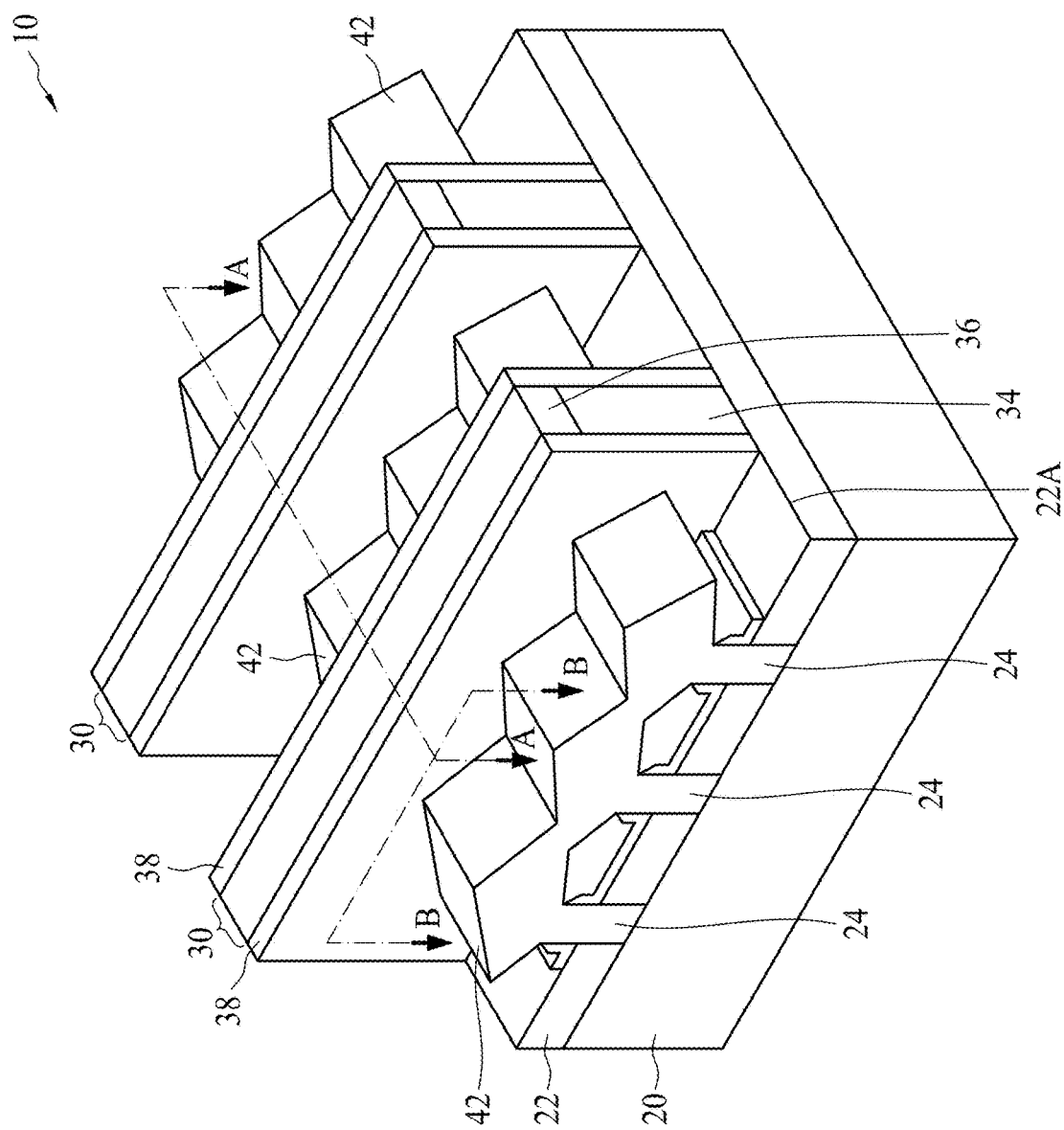
Figure 9A:
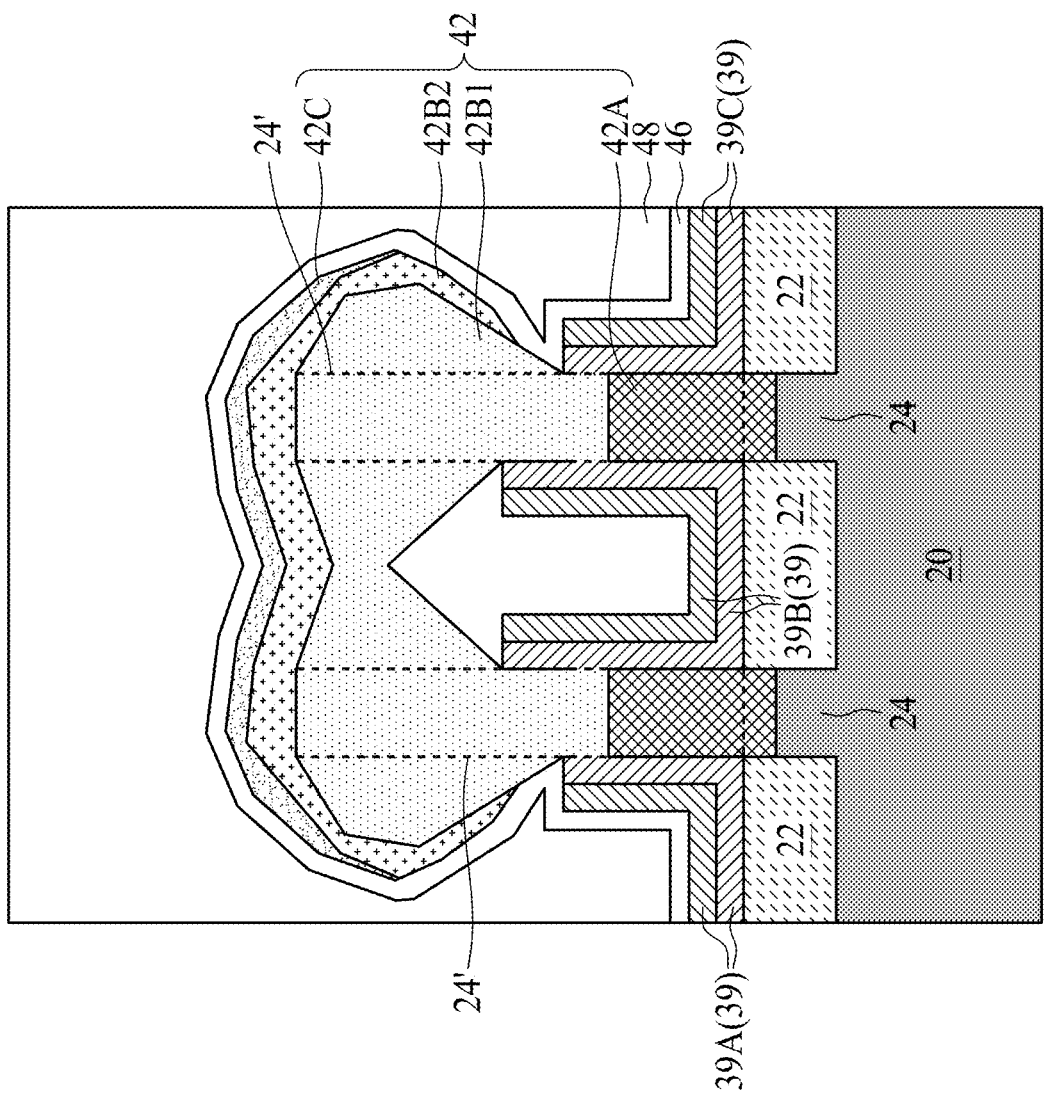
Figure 9B:
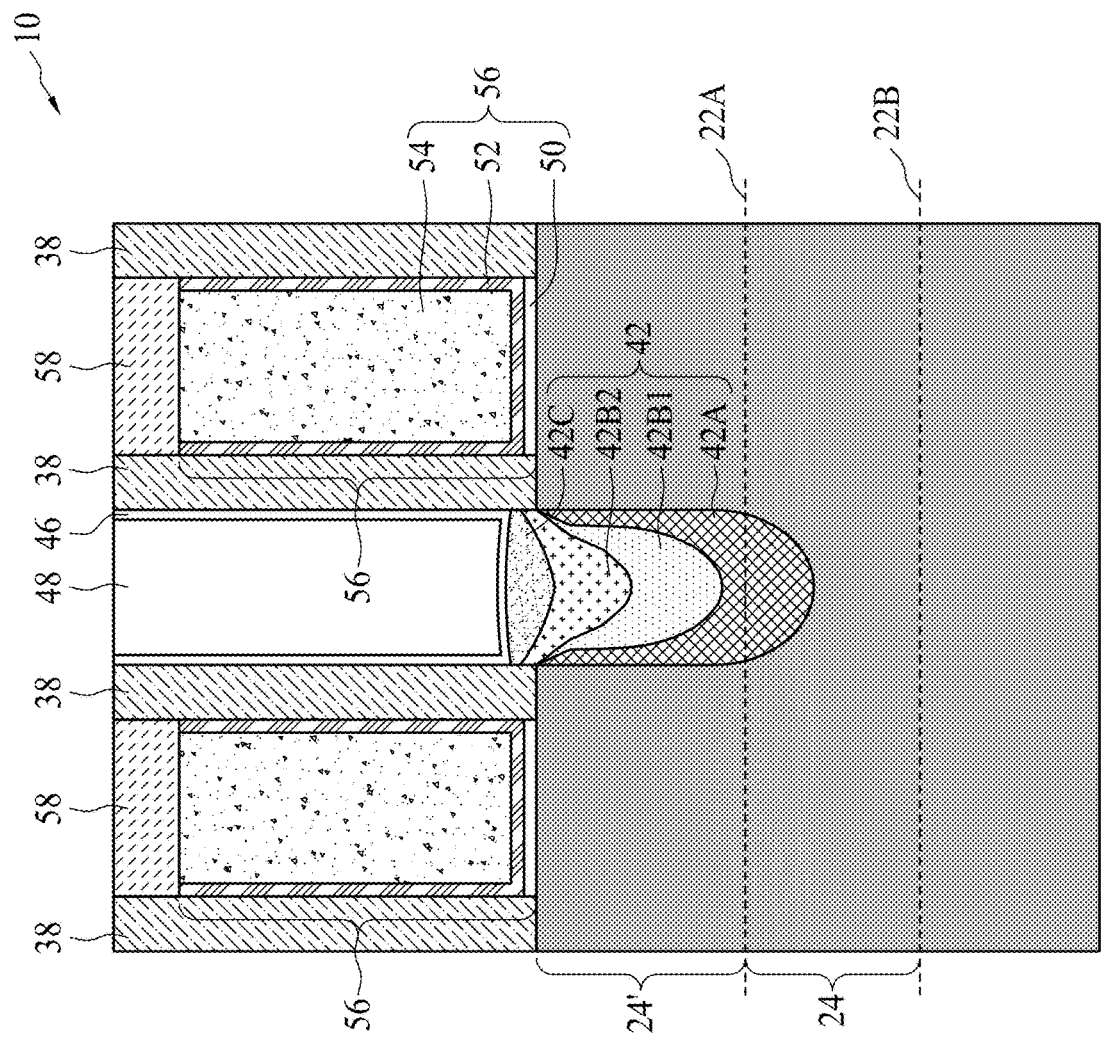

Referring to FIGS. 9A and 9B, Contact etch stop layer (CESL) 46 and Inter-Layer Dielectric (ILD) 48 are formed over epitaxy regions 42, and on the sides of dummy gate stacks 30 (FIG. 8C). The respective process is illustrated as process 224 in the process flow 200 shown in FIG. 16. A planarization process such as a Chemical Mechanical Polish (CMP) process or a mechanical grinding process is performed to remove excess portions of CESL 46 and ILD 48, until dummy gate stacks 30 (FIG. 8A) are exposed. The dummy gate stacks 30 are replaced with replacement gate stacks 56 as shown in FIG. 9B. The processes for forming the replacement gate stacks are not shown. The resulting replacement gate stacks 56, however, are shown in FIG. 9A. Replacement gate stacks 56 include gate dielectrics, which further include interfacial layers 50 on the top surfaces and sidewalls of protruding fins 24', and high-k dielectrics 52 on the interfacial layers. Replacement gate stacks 56 further include gate electrodes 54 over high-k dielectrics 52. After the formation of replacement gate stacks 56, replacement gate stacks 56 are recessed to form trenches between gate spacers 38. A dielectric material such as silicon nitride, silicon oxynitride, or the like, is filled into the resulting trenches to form hard masks 58.

Figure 10A:
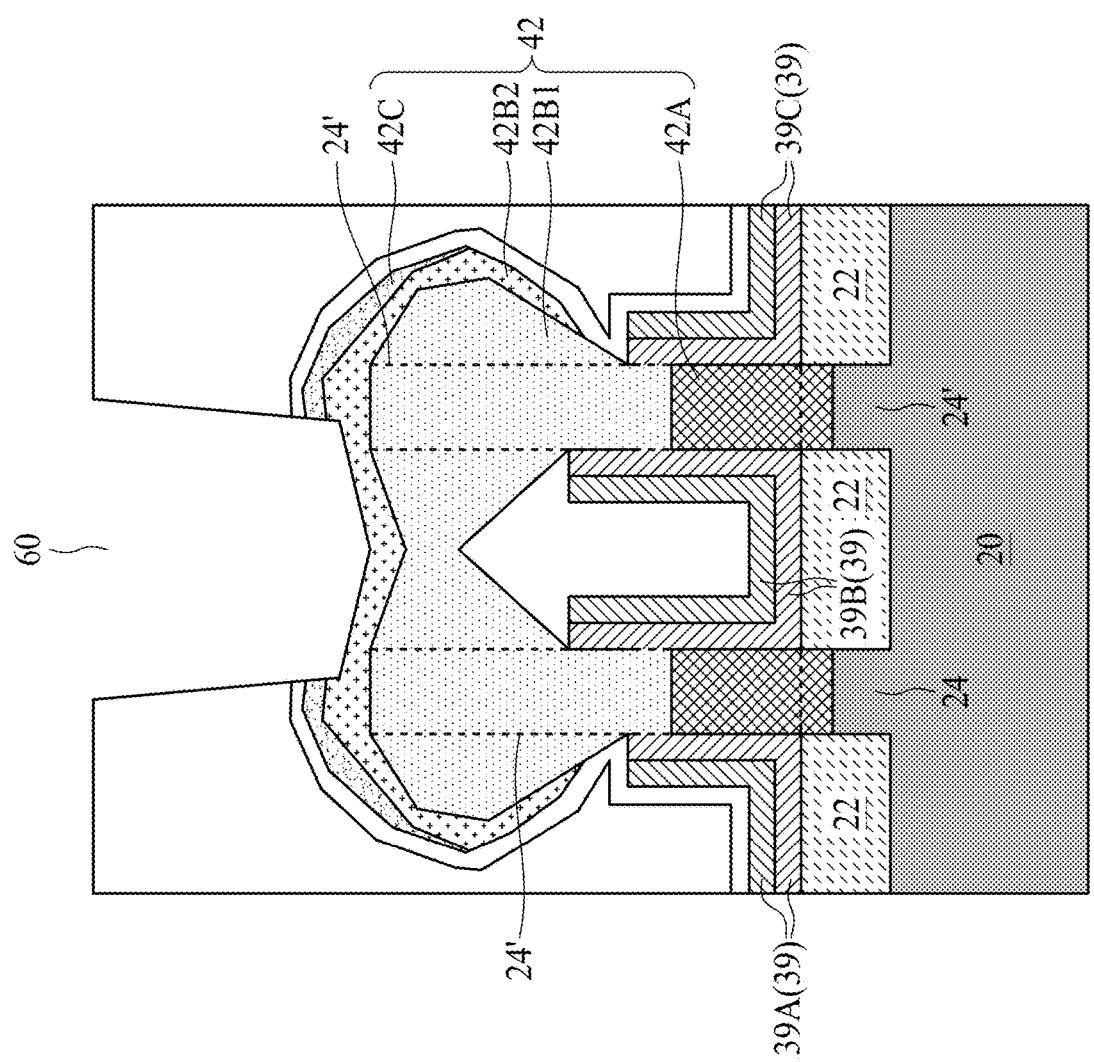
Figure 10B:
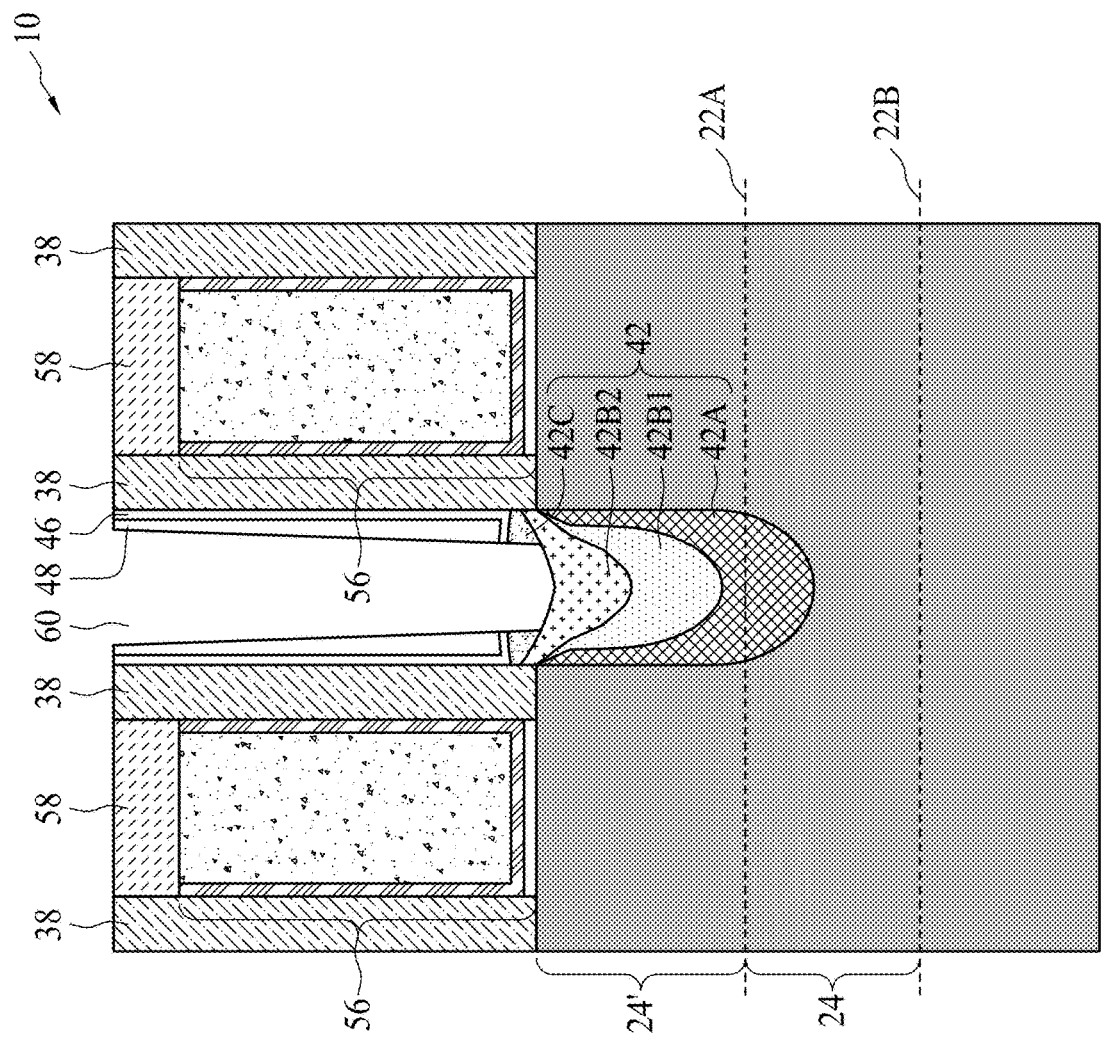

Next, as shown in FIGS. 10A and 10B, ILD 48 and CESL 46 are etched to form contact opening 60. Opening 60 penetrates through epitaxy layer 42C, so that epitaxy layer 42B2 is exposed. The respective process is illustrated as process 226 in the process flow 200 shown in FIG. 16. As shown in both of FIGS. 10A and 10B, epitaxy layer 42C is etched-through, and the top surface of epitaxy layer 42B2 is exposed. The adding of germanium in epitaxy layer 42C results in the etching rate of epitaxy layer 42C to be significantly greater than the etching rate of epitaxy layer 42B2, and hence by controlling the etching process, the etching may be substantially stopped on epitaxy layer 42B2, with the over-etching of epitaxy layer 42B2 being small. As shown in FIG. 10A, the exposed top surface of epitaxy layer 42B2 is wavy, with the middle portion being recessed relative to the opposing portions on the opposite sides of the middle portion, so that the middle portion has a V-shape in the cross-sectional view.

Figure 11A:
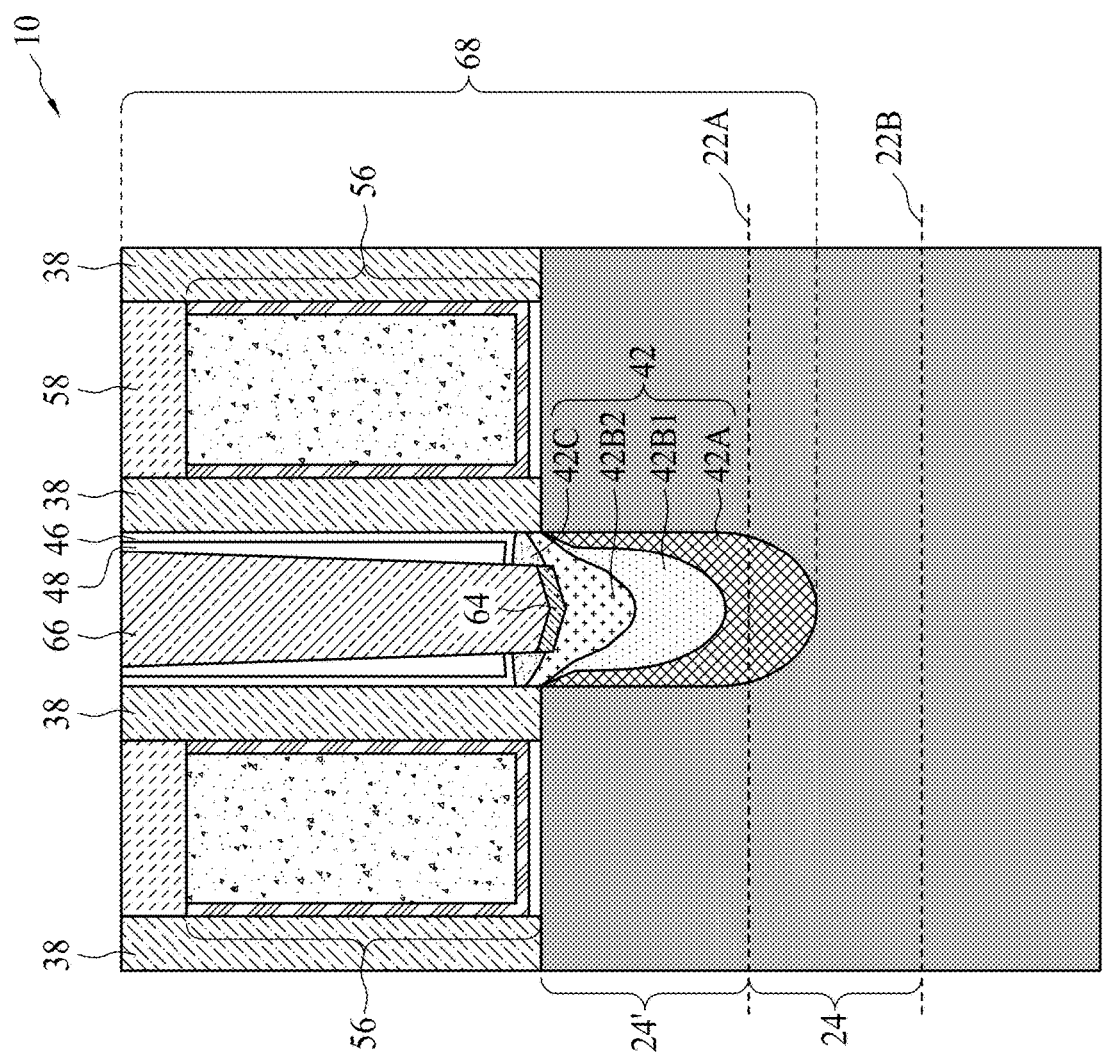
Figure 11B:
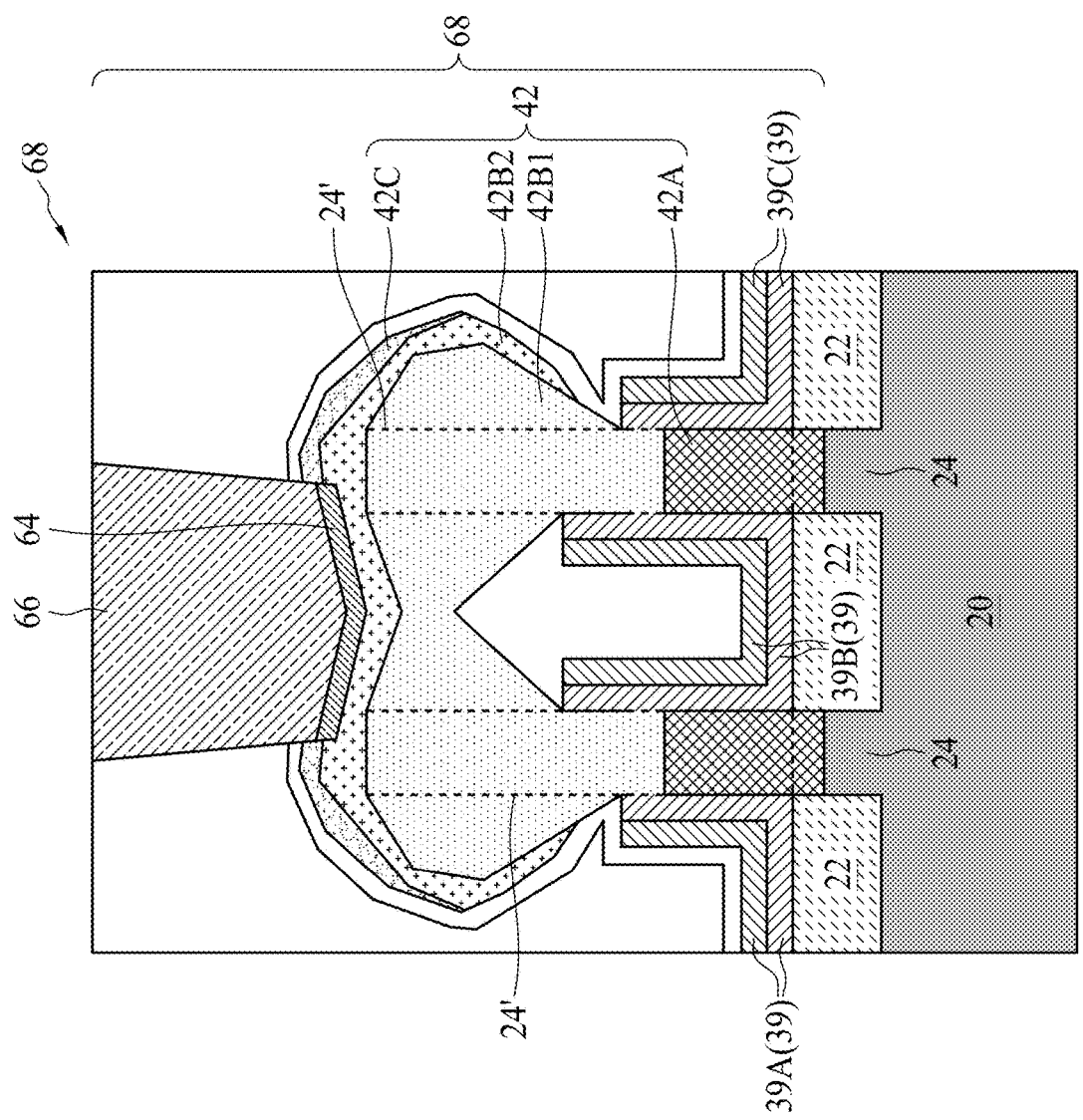
Figure 11C:
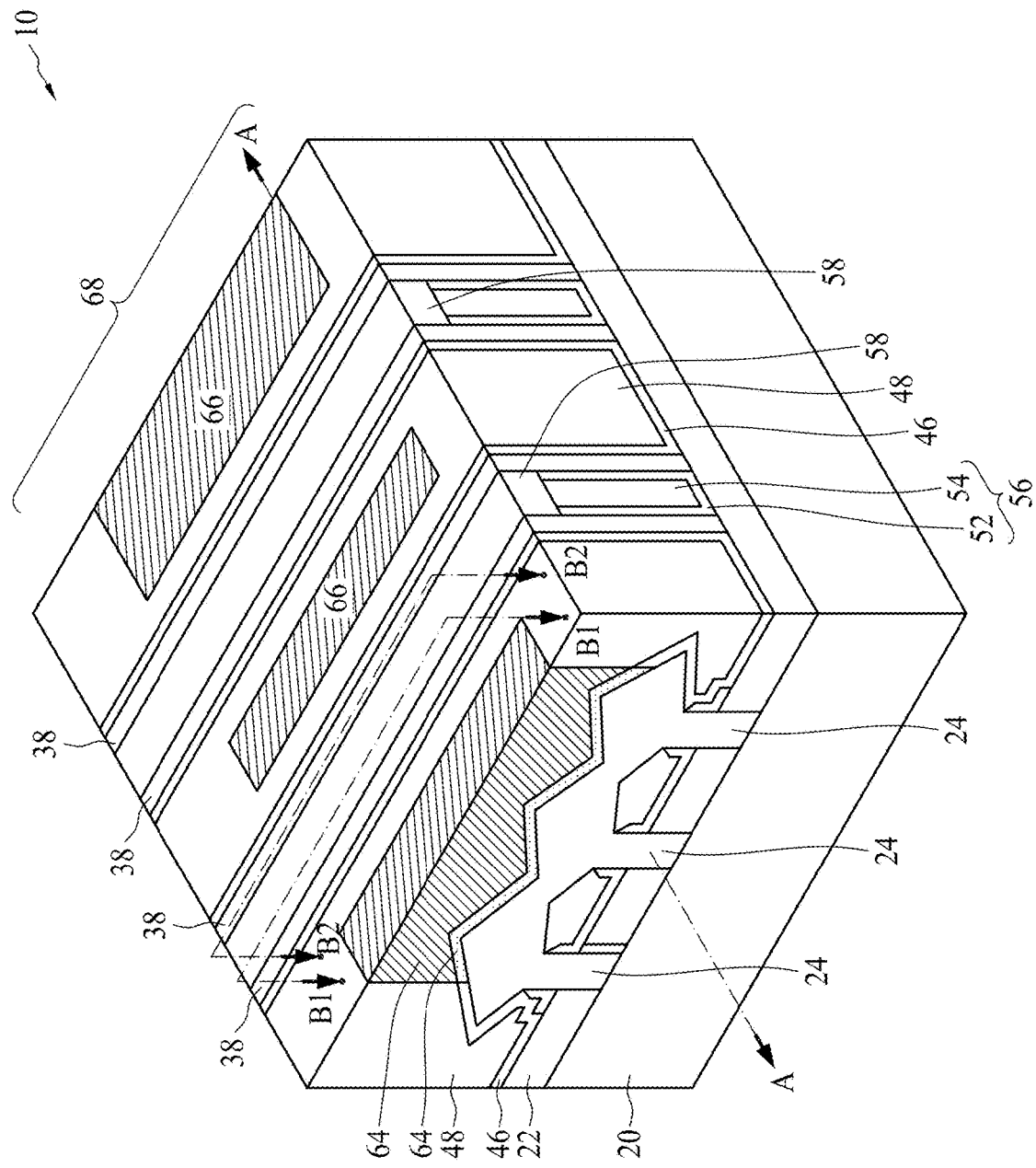

Next, as shown in FIGS. 11A, 11B, and 11C, source/drain silicide region 64 and source/drain contact plug 66 are formed. FIG. 11A illustrates the cross-sectional view in the vertical reference cross-section A-A in FIG. 11C. FIG. 11B illustrates the cross-sectional view in the vertical reference cross-section B1-B1 in FIG. 11C (except FIG. 11B shows two fins, while FIG. 11C shows three fins). In accordance with some embodiments of the present disclosure, the formation of the source/drain silicide region 64 includes depositing a metal layer such as a titanium layer, a cobalt layer, or the like, extending into opening 60 (FIGS. 10A and 10B), and then performing an annealing process so that the bottom portion of the metal layer reacts with epitaxy layer 42B2 to form a silicide region. The respective process is illustrated as process 228 in the process flow 200 shown in FIG. 16. The remaining un-reacted metal layer may be removed. Source/drain contact plug 66 is then formed in trench 60, and is electrically connected to the respective source/drain silicide region 64. The respective process is illustrated as process 230 in the process flow 200 shown in FIG. 16. FinFET 68 is thus formed.

Figure 12:
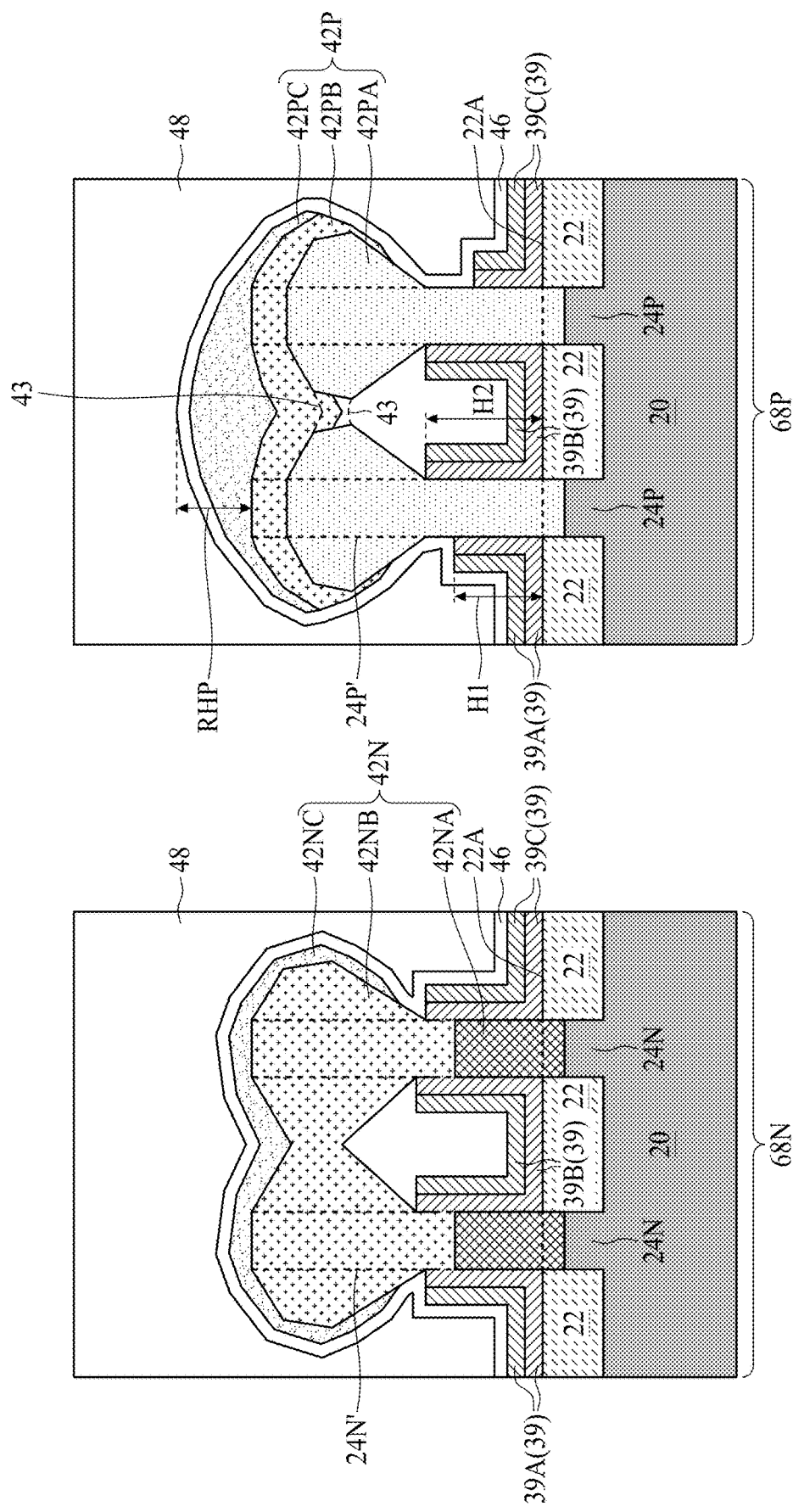
FIGS. 12 and 13 illustrate the cross-sectional views of intermediate stages in the formation of an n-type FinFET and a p-type FinFET in accordance with some embodiments.

The embodiments of the present disclosure may be implemented in both of n-type FinFET and p-type FinFETs. For example, FIG. 12 illustrates an intermediate stage, in which n-type FinFET 68N and p-type FinFET 68P are both formed on the same substrate 20. The corresponding layers in epitaxy regions are inserted with letter "N" or "P" following reference numeral "42" to indicate the source/drain region 42N of the n-type FinFET 68N is of n-type, and the source/drain region 42P of the p-type FinFET 68P is of P-type. The details of epitaxy layers 42NA, 42NB, and 42NC may be found referring to the disclosure referring to preceding figures (with 42NB possibly including 42B1 and 42B2), and are not repeated herein. Both of epitaxy regions 42N and 42P extend to levels below the top surfaces 22A of STI regions 22.

In accordance with some embodiments, as illustrated in FIG. 12, for the N-type source/drain region 42N, the top surface of epitaxy layers 42NB and 42NC is wavy. On the other hand, for the p-type source/drain region 42P, the top surface of epitaxy layer 42PB is wavy, while the top surface of epitaxy layer 42PC has a cone shape, with the middle portion between two neighboring fins being the highest. Experiments have revealed that the fins of p-type FinFETs have severe bending problem if the source/drain regions 42P of the p-type FinFET have wavy top surface. By forming the p-type source/drain regions as having cone-shapes, the fin bending in the fins of the p-type FinFET is reduced. On the other hand, fin bending is not an issue for n-type FinFETs, so source/drain region 42N may be formed as having wavy shapes. The cone-shape of the p-type source/drain region 42P may be achieved, for example, by increasing the thickness of epitaxy layers 42P and the corresponding raising height RHP, adjusting the process conditions to increase the height H2 of inner fin spacers 39B to be significantly greater than the height H1, or the like. In accordance with some embodiments, epitaxy layers 42PA, 42PB, and 42PC may be formed of SiB, SiGeB, or the like. The epitaxy layers 42PA grown from neighboring recesses may be separated from each other, or may be merged, as represented by dashed lines 43, which shows the merged portion. The processes for forming the p-type FinFET are also the same as the process shown in preceding figures, except the materials of epitaxy layers 42PA, 42PB, and 42PC are different from the epitaxy region of n-type FinFET 68N. In accordance with some embodiments, the boron concentration in epitaxy layer 42PA may be in the range from about $1E20/cm^3$ and about $6E20/cm^3$. The boron concentration in epitaxy layer 42PB may be is in the range from about $6E20/cm^3$ and about $3E21/cm^3$. The boron concentration in epitaxy layer 42PC may be is in the range from about $1E21/cm^3$ and about $8E21/cm^3$. The germanium atomic percentage range in epitaxy layer 42PA may be in the range from about 15% and about 40%. The germanium atomic percentage range in epitaxy layer 42PB may be in the range from about 40% and about 60%. The germanium atomic percentage range in epitaxy layer 42PC may be in the range from about 45% and about 55%. The protruding fins of the p-type FinFETs, which protruding fins are under the corresponding replacement gate stacks, may be formed of silicon germanium or germanium.

Figure 13:
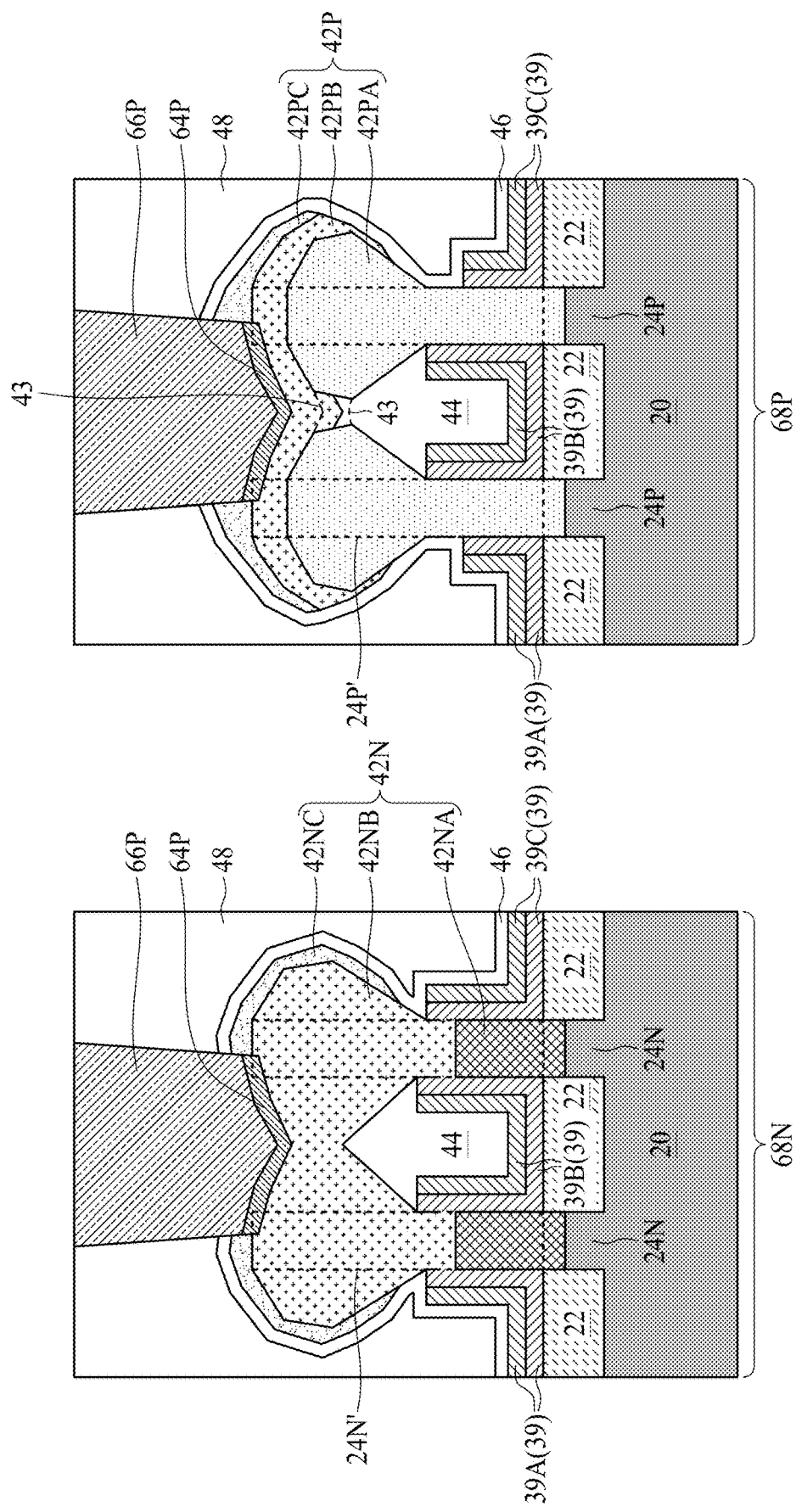

FIG. 13 illustrates the structure after the formation of source/drain silicide regions 64N and 64P and source/drain contact plugs 66N and 66P are formed. In accordance with some embodiments, source/drain silicide region 64P and source/drain contact plug 66P penetrate through epitaxy layer 42PC and stop on epitaxy layer 42PB. The interface of source/drain silicide region 64P and epitaxy layer 42PB is also wavy, hence the contact area is increased.

It is appreciated that the cross-sectional views shown in FIGS. 12 and 13 may both be found in the final FinFETs 68N and 68P. For example, the cross-sectional view shown in FIG. 12 may be obtained from the reference cross-section B2-B2 in FIG. 11C, and from the corresponding n-type FinFET and p-type FinFET. The cross-sectional view shown in FIG. 13 may be obtained from the reference cross-section B1-B1 in FIG. 11C, and from the corresponding n-type FinFET and p-type FinFET.

Figure 14:
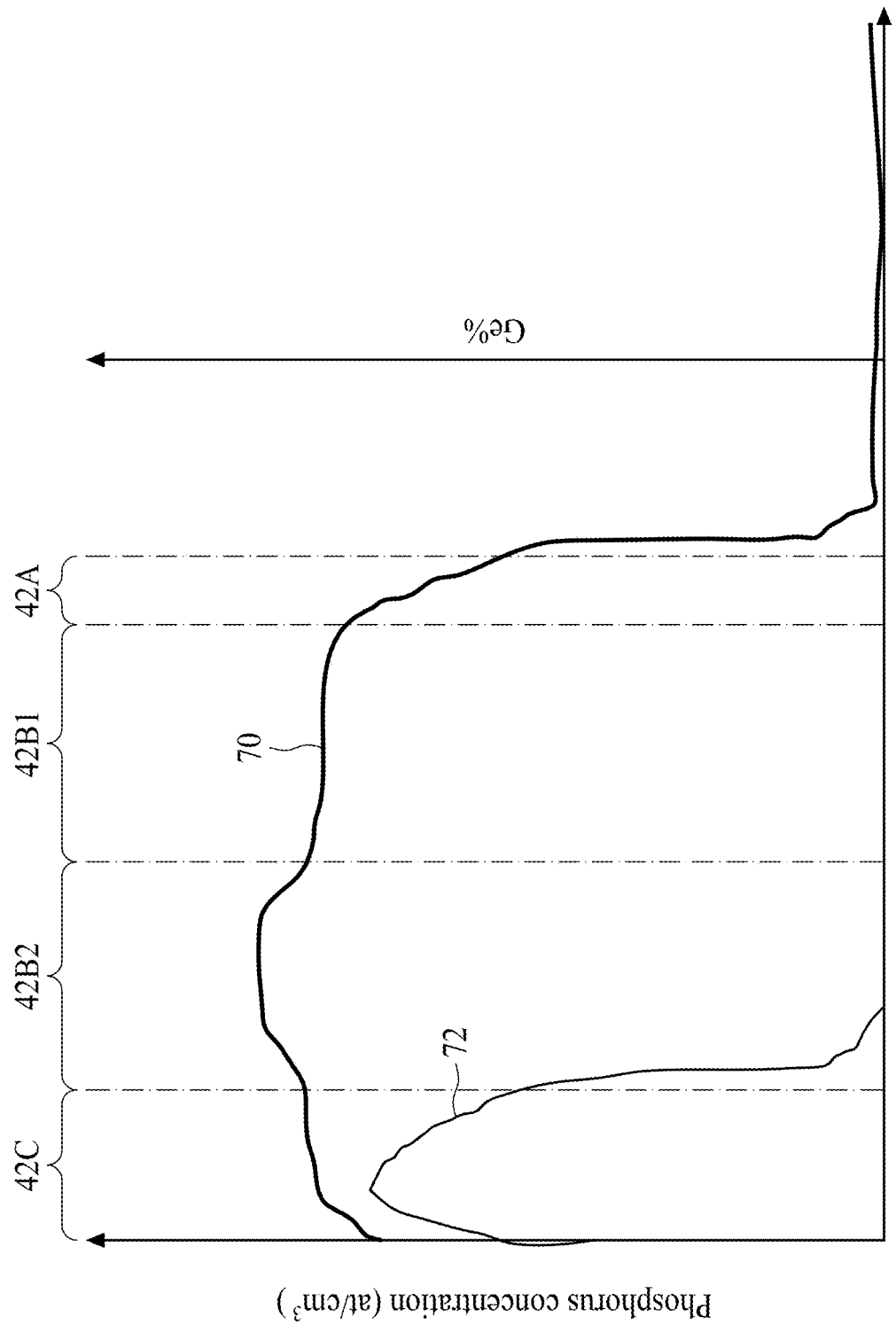
FIG. 14 illustrates the distribution of phosphorous and germanium in an epitaxy region of an n-type FinFET in accordance with some embodiments.

FIG. 14 illustrates the distribution profiles of phosphorus (the left Y-axis) and germanium (the right Y-axis) in epitaxy layers 42C, 42B2, 42B1, and 42A of an n-type FinFET in accordance with some embodiments. The corresponding epitaxy layer 42A is a single SiP layer in the illustrated example. The left Y-axis shows the phosphorous concentration, which is represented by line 70. The right Y-axis shows the germanium atomic percentage, which is represented by line 72.

Figure 15:
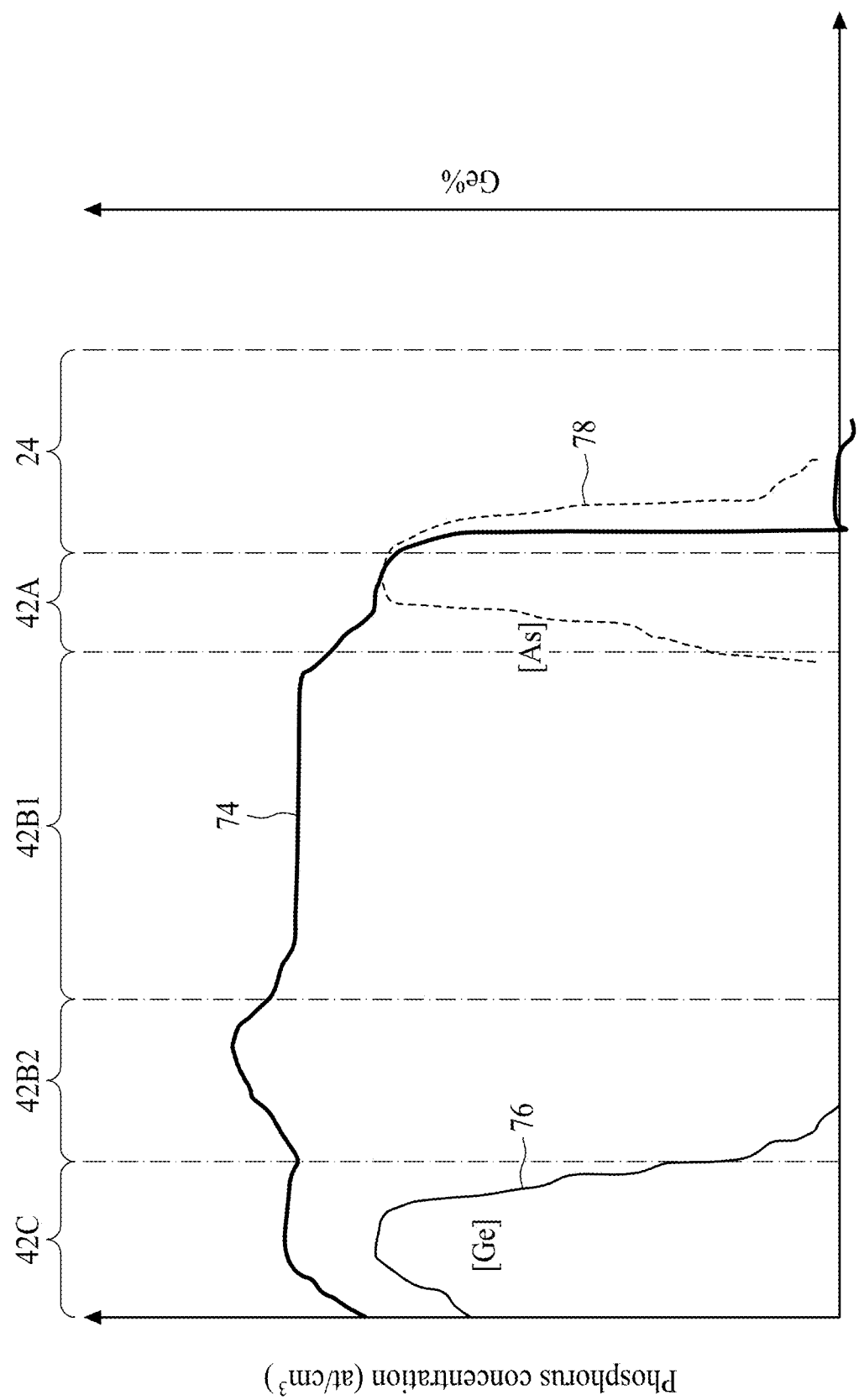
FIG. 15 illustrates the distribution of phosphorous, arsenic, and germanium in an epitaxy region of an n-type FinFET in accordance with some embodiments.

FIG. 15 illustrates the distribution profiles of phosphorus and arsenic (the left Y-axis) and germanium (the right Y-axis) in layers 42C, 42B2, 42B1, and 42A of an n-type FinFET in accordance with some embodiments. The corresponding epitaxy layer 42A includes a SiAs layer and a SiP layer on the SiAs layer. The left Y-axis shows the phosphorous concentration, which is represented by line 74, and the arsenic concentration, which is represented by line 78. The right Y-axis shows the germanium atomic percentages of Ge, wherein the atomic concentration of Ge is represented by line 76.

The embodiments of the present disclosure have some advantageous features. By recessing protruding fins and further recessing the semiconductor strips underlying the protruding fins, so that the recesses extend to a level below the top surfaces of STI regions, it is easy to control the dopant of the bottom portion (L1) of the source/drain regions. Accordingly, there is better control of dopant diffusion into the channel. Short channel effect is thus prevented.

In accordance with some embodiments of the present disclosure, a method comprises forming isolation regions extending into a semiconductor substrate; forming a first plurality of semiconductor fins protruding higher than top surfaces of the isolation regions; forming a first gate stack on the first plurality of semiconductor fins; forming a gate spacer on a sidewall of the first gate stack; recessing the first plurality of semiconductor fins to form a first plurality of recesses on a side of the first gate stack, wherein the first plurality of recesses extend to a level lower than top surfaces of the isolation regions; and performing first epitaxy processes to grow a first epitaxy region, wherein the first epitaxy region fills the first plurality of recesses. In an embodiment, the device further comprises forming fin spacers on opposing sides of the first plurality of semiconductor fins, wherein the first epitaxy region comprises a first epitaxy layer, a second epitaxy layer over the first epitaxy layer, and a third epitaxy layer over the second epitaxy layer, wherein a top surface of the first epitaxy layer has a lowest point, and the lowest point is lower than top ends of the fin spacers. In an embodiment, portions of the second epitaxy layer grown from neighboring ones of the first plurality of recesses are merged. In an embodiment, the first epitaxy region is of n-type, and has a wavy top surface, and the method further comprises forming a second plurality of semiconductor fins protruding higher than the top surfaces of the isolation regions; forming a second gate stack on the second plurality of semiconductor fins; recessing the second plurality of semiconductor fins to form a second plurality of recesses, wherein the second plurality of recesses extend to an additional level lower than the top surfaces of the isolation regions; and performing second epitaxy processes to grow a second epitaxy region, wherein the second epitaxy region fills the second plurality of recesses, and the second epitaxy region is of p-type, and has a cone shape. In an embodiment, the first epitaxy processes comprise a first epitaxy process to grow a first epitaxy layer in one of the first plurality of recesses, wherein the first epitaxy layer has a first dopant concentration; a second epitaxy process to grow a second epitaxy layer over the first epitaxy layer, wherein the second epitaxy layer has a second dopant concentration higher than the first dopant concentration; and a third epitaxy process to grow a third epitaxy layer over the second epitaxy layer. In an embodiment, the second epitaxy layer is an embedded stressor comprising: a top portion higher than top surfaces of the first plurality of semiconductor fins, wherein the top portion has a first sidewall contacting a second sidewall of the gate spacer, and the sidewall has a bottom end level with the top surfaces of the first plurality of semiconductor fins; and a bottom portion lower than the top surfaces of the first plurality of semiconductor fins. In an embodiment, the device further comprises, after the first epitaxy process, performing an etching process on the first epitaxy layer. In an embodiment, the etching process is performed using a process gas comprising an etching gas and silane.

In accordance with some embodiments of the present disclosure, a device comprises a semiconductor substrate; isolation regions extending into the semiconductor substrate; a semiconductor fin between the isolation regions, wherein the semiconductor fin protrudes higher than top surfaces of the isolation regions; a gate stack on a top surface and sidewalls of the semiconductor fin; and an epitaxy source/drain region on a side of the semiconductor fin, wherein the epitaxy source/drain region extends to a level lower than top surfaces of the isolation regions. In an embodiment, the epitaxy source/drain region comprises a first semiconductor layer having a first dopant concentration; and an embedded stressor over and contacting the first semiconductor layer, wherein the embedded stressor has a second dopant concentration higher than the first dopant concentration, and wherein the embedded stressor has an upper portion higher than the top surface of the semiconductor fin, and a lower portion lower than the top surface of the semiconductor fin. In an embodiment, the embedded stressor comprises silicon phosphorous, and the device further comprises a capping layer over the embedded stressor, and wherein the capping layer comprises silicon, germanium, and phosphorous. In an embodiment, the device further comprises a first fin spacer and a second fin spacer on opposing sides of the semiconductor fin, wherein the first semiconductor layer has an additional top surface, and a lowest point of the additional top surface is level with or lower than top ends of the first fin spacer and the second fin spacer. In an embodiment, the lowest point of the additional top surface of the first semiconductor layer is level with the top ends of the first fin spacer and the second fin spacer. In an embodiment, the lowest point of the additional top surface is lower than the top ends of the first fin spacer and the second fin spacer. In an embodiment, the device further comprises a source/drain silicide region over and contacting the epitaxy source/drain region, wherein the source/drain silicide region has a V-shape in a cross-sectional view of the epitaxy source/drain region. In an embodiment, the epitaxy source/drain region has a wavy top surface, and the epitaxy source/drain region is of n-type, and the device further comprises additional isolation regions extending into the semiconductor substrate; an additional semiconductor fin protruding higher than top surfaces of the additional isolation regions; an additional gate stack on a top surface and sidewalls of the additional semiconductor fin; and an additional epitaxy source/drain region on a side of the additional semiconductor fin, wherein the additional epitaxy source/drain region extends to a level lower than top surfaces of the additional isolation regions, and a top portion of the additional epitaxy source/drain region has a cone shape, and wherein the additional epitaxy source/drain region is of p-type.

In accordance with some embodiments of the present disclosure, a device comprises a semiconductor fin; isolation regions on opposing sides of the semiconductor fin, wherein the semiconductor fin protrudes higher than top surfaces of the isolation regions; a gate stack on the semiconductor fin; and an epitaxy semiconductor region on a side of the semiconductor fin, wherein the epitaxy semiconductor region extends to a level lower than top surfaces of the isolation regions, and wherein the epitaxy semiconductor region comprises an embedded stressor, and the embedded stressor comprises a V-shaped bottom surface, wherein a top end of the V-shaped bottom surface is at a same level as a top surface of the semiconductor fin; and a V-shaped top surface, wherein a first portion of the V-shaped top surface is higher than the top surface of the semiconductor fin, and a second portion of the V-shaped top surface is lower than the top surface of the semiconductor fin. In an embodiment, the device further comprises a semiconductor layer underlying the embedded stressor, wherein the semiconductor layer comprises a facet on a (111) surface plane of the semiconductor layer. In an embodiment, wherein the facet on the (111) surface plane extends to join a top corner of the semiconductor fin. In an embodiment, the device further comprises fin spacers on opposing sides of a portion of the embedded stressor, wherein the embedded stressor has a bottommost point higher than a top end of one of the fin spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming isolation regions extending into a semiconductor substrate;
    forming a first plurality of semiconductor fins protruding higher than top surfaces of the isolation regions;
    forming a first gate stack on the first plurality of semiconductor fins;
    forming a gate spacer on a sidewall of the first gate stack;
    recessing the first plurality of semiconductor fins to form a first plurality of recesses on a side of the first gate stack, wherein the first plurality of recesses extend to a level lower than top surfaces of the isolation regions;
    performing first epitaxy processes to grow a first epitaxy region, wherein the first epitaxy region fills the first plurality of recesses; and
    forming fin spacers on opposing sides of the first plurality of semiconductor fins, wherein the first epitaxy region comprises a first epitaxy layer, a second epitaxy layer over the first epitaxy layer, and a third epitaxy layer over the second epitaxy layer, and wherein a top surface of the first epitaxy layer has a lowest point, and the lowest point is lower than top ends of the fin spacers.

2. The method of claim 1, wherein portions of the second epitaxy layer grown from neighboring ones of the first plurality of recesses are merged.

3. The method of claim 1, wherein the first epitaxy region is of n-type, and has a wavy top surface, and the method further comprises:
    forming a second plurality of semiconductor fins protruding higher than the top surfaces of the isolation regions;
    forming a second gate stack on the second plurality of semiconductor fins;
    recessing the second plurality of semiconductor fins to form a second plurality of recesses, wherein the second plurality of recesses extend to an additional level lower than the top surfaces of the isolation regions; and
    performing second epitaxy processes to grow a second epitaxy region, wherein the second epitaxy region fills the second plurality of recesses, and the second epitaxy region is of p-type, and has a cone shape.

4. The method of claim 1, wherein the first epitaxy processes comprise:
    an additional first epitaxy process to grow the first epitaxy layer in one of the first plurality of recesses, wherein the first epitaxy layer has a first dopant concentration;
    an additional second epitaxy process to grow the second epitaxy layer over the first epitaxy layer, wherein the second epitaxy layer has a second dopant concentration higher than the first dopant concentration; and
    a third epitaxy process to grow the third epitaxy layer over the second epitaxy layer.

5. The method of claim 4, wherein the second epitaxy layer is an embedded stressor comprising:
    a top portion higher than top surfaces of the first plurality of semiconductor fins, wherein the top portion has a first sidewall contacting a second sidewall of the gate spacer, and the sidewall has a bottom end level with the top surfaces of the first plurality of semiconductor fins; and
    a bottom portion lower than the top surfaces of the first plurality of semiconductor fins.

6. The method of claim 4 further comprising, after the additional first epitaxy process, performing an etching process on the first epitaxy layer.

7. The method of claim 6, wherein the etching process is performed using a process gas comprising an etching gas and silane.

8. A method comprising:
    forming isolation regions extending into a semiconductor substrate;
    forming a semiconductor fin between the isolation regions, wherein the semiconductor fin protrudes higher than top surfaces of the isolation regions;
    forming a gate stack on a top surface and sidewalls of the semiconductor fin; and
    forming an epitaxy source/drain region on a side of the semiconductor fin, wherein the epitaxy source/drain region extends to a level lower than top surfaces of the isolation regions, and wherein the forming the epitaxy source/drain region comprises:
        depositing a first semiconductor layer having a first dopant concentration; and
        depositing an embedded stressor over and contacting the first semiconductor layer, wherein the embedded stressor has a second dopant concentration higher than the first dopant concentration, and wherein the embedded stressor has an upper portion higher than the top surface of the semiconductor fin, and a lower portion lower than the top surface of the semiconductor fin.

9. The method of claim 8, wherein the depositing the embedded stressor comprises deposing silicon phosphorous, and the method further comprises forming a capping layer over the embedded stressor, and wherein the capping layer comprises silicon, germanium, and phosphorous.

10. The method of claim 8 further comprising:
    before the epitaxy source/drain region is formed, forming a first fin spacer and a second fin spacer, wherein the epitaxy source/drain region comprises a portion between the first fin spacer and the second fin spacer, wherein the first semiconductor layer has an additional top surface, and a lowest point of the additional top surface is level with or lower than top ends of the first fin spacer and the second fin spacer.

11. The method of claim 10, wherein the lowest point of the additional top surface of the first semiconductor layer is level with the top ends of the first fin spacer and the second fin spacer.

12. The method of claim 10, wherein the lowest point of the additional top surface is lower than the top ends of the first fin spacer and the second fin spacer.

13. The method of claim 8 further comprising forming a source/drain silicide region over and contacting the epitaxy source/drain region, wherein the source/drain silicide region has a V-shape in a cross-sectional view of the epitaxy source/drain region.

14. The method of claim 8, wherein the epitaxy source/drain region is formed as having a wavy top surface, and the epitaxy source/drain region is of n-type, and the method further comprises:
    forming additional isolation regions extending into the semiconductor substrate;
    forming an additional semiconductor fin protruding higher than top surfaces of the additional isolation regions;
    forming an additional gate stack on a top surface and sidewalls of the additional semiconductor fin; and
    forming an additional epitaxy source/drain region on a side of the additional semiconductor fin, wherein the additional epitaxy source/drain region extends to a level lower than top surfaces of the additional isolation regions, and a top portion of the additional epitaxy source/drain region has a cone shape, and wherein the additional epitaxy source/drain region is of p-type.

15. A method comprising:
forming isolation regions on opposing sides of a semiconductor fin, wherein the semiconductor fin protrudes higher than top surfaces of the isolation regions;
forming a gate stack on the semiconductor fin; and
performing epitaxy processes to form an epitaxy semiconductor region on a side of the semiconductor fin, wherein the epitaxy semiconductor region extends to a level lower than top surfaces of the isolation regions, and wherein the epitaxy semiconductor region comprises an embedded stressor, and the embedded stressor comprises:
   a V-shaped bottom surface, wherein a top end of the V-shaped bottom surface is at a same level as a top surface of the semiconductor fin; and
   a V-shaped top surface, wherein a first portion of the V-shaped top surface is higher than the top surface of the semiconductor fin, and a second portion of the V-shaped top surface is lower than the top surface of the semiconductor fin.

16. The method of claim 15, wherein the embedded stressor is formed over a semiconductor layer, and wherein the semiconductor layer comprises a facet on a (111) surface plane of the semiconductor layer.

17. The method of claim 15, wherein the facet on the (111) surface plane extends to join a top corner of the semiconductor fin.

18. The method of claim 17 further comprising, before the epitaxy processes, forming fin spacers on opposing sides of a portion of the embedded stressor, wherein the embedded stressor has a bottommost point higher than a top end of one of the fin spacers.

19. The method of claim 1, wherein the first epitaxy processes are n-type regions.

20. The method of claim 15, wherein the epitaxy semiconductor region is an n-type region.

* * * * *